US007310768B2

(12) United States Patent
Eidson et al.

(10) Patent No.: US 7,310,768 B2
(45) Date of Patent: *Dec. 18, 2007

(54) ITERATIVE DECODER EMPLOYING MULTIPLE EXTERNAL CODE ERROR CHECKS TO LOWER THE ERROR FLOOR

(75) Inventors: Donald Brian Eidson, La Jolla, CA (US); Abraham Krieger, San Diego, CA (US); Ramaswamy Murali, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 55 days.

This patent is subject to a terminal disclaimer.

(21) Appl. No.: 10/892,738

(22) Filed: Jul. 16, 2004

(65) Prior Publication Data

US 2004/0261002 A1    Dec. 23, 2004

Related U.S. Application Data

(63) Continuation of application No. 09/865,958, filed on May 25, 2001, now Pat. No. 6,810,502, which is a continuation-in-part of application No. 09/492,962, filed on Jan. 28, 2000, now Pat. No. 6,606,724.

(51) Int. Cl.
*H03M 13/03* (2006.01)
(52) U.S. Cl. ....................... 714/786; 714/792
(58) Field of Classification Search ............. 714/755, 714/786, 792; 375/136, 233
See application file for complete search history.

(56) References Cited

U.S. PATENT DOCUMENTS 6,263,467 B1 * 7/2001 Hladik et al. ............... 714/755

| | | | |
|---|---|---|---|
| 6,377,610 B1 * | 4/2002 | Hagenauer et al. | 375/136 |
| 6,484,283 B2 * | 11/2002 | Stephen et al. | 714/786 |
| 6,570,919 B1 * | 5/2003 | Lee | 375/233 |
| 6,606,724 B1 * | 8/2003 | Krieger et al. | 714/755 |

FOREIGN PATENT DOCUMENTS

GB    2 332 835 A    *    6/1999

* cited by examiner

*Primary Examiner*—David Ton
(74) *Attorney, Agent, or Firm*—Howrey LLP

(57) ABSTRACT

Iterative decoder employing multiple external code error checks to lower the error floor and/or improve decoding performance. Data block redundancy, sometimes via a cyclic redundancy check (CRC) or Reed Solomon (RS) code, enables enhanced iterative decoding performance. Improved decoding performance is achieved during interim iterations before the final iteration. A correctly decoded CRC block, indicating a decoded segment is correct with a high degree of certainty, assigns a very high confidence level to the bits in this segment and is fed back to inner and/or outer decoders (with interleaving, when appropriate) for improved iterative decoding. High confidence bits may be scattered throughout inner decoded frames to influence other bit decisions in subsequent iterations. Turbo decoders typically operate relatively well at regions where the BER is high; the invention improves iterative decoder operation at lower BERs, lowering the 'BER floor' that is sometimes problematic with conventional turbo decoders.

12 Claims, 22 Drawing Sheets

Extrinsic Information

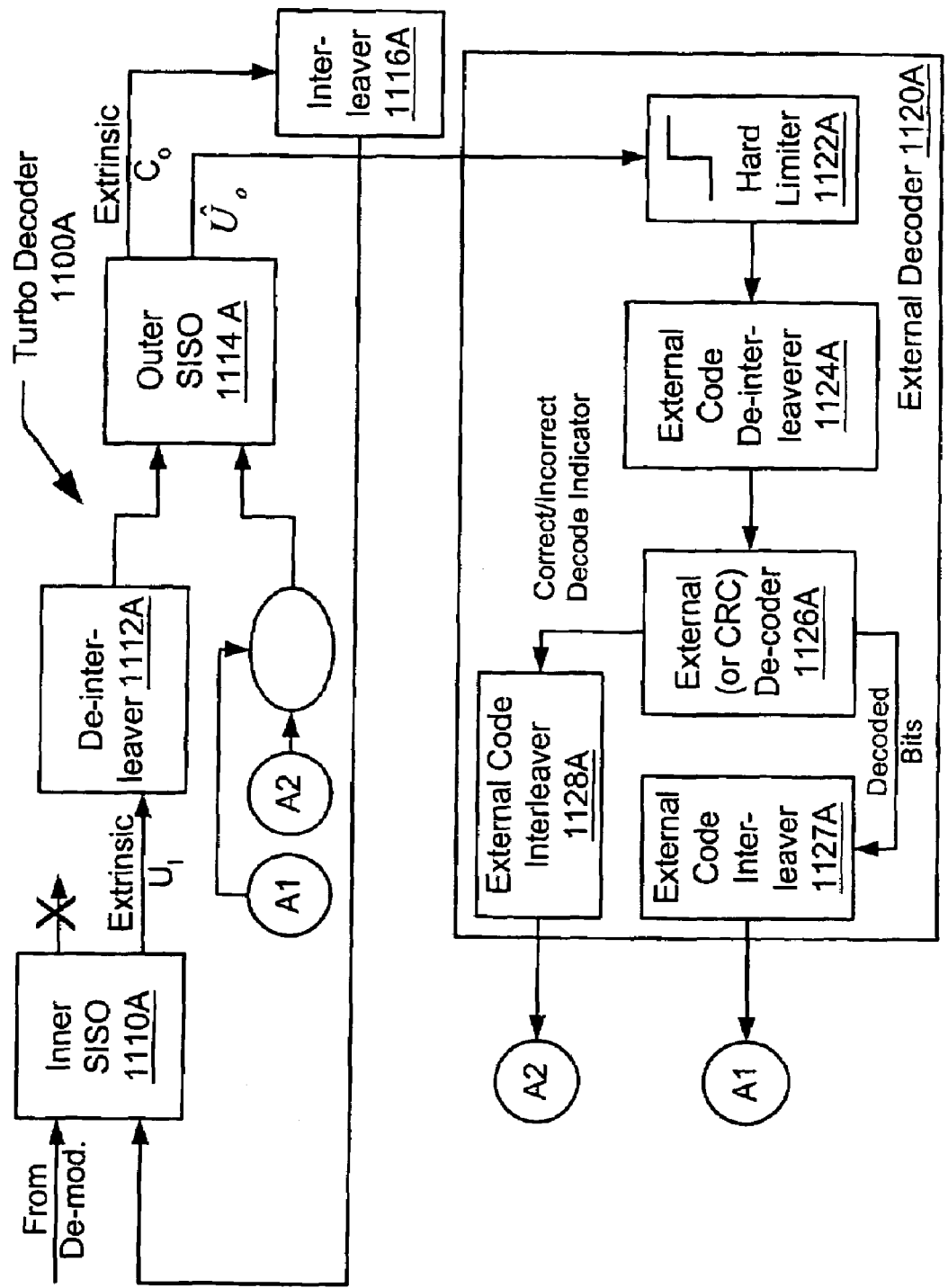
Fig. 11A   Outer SISO Feedback Implementation

ITERATIVE DECODER EMPLOYING MULTIPLE EXTERNAL CODE ERROR CHECKS TO LOWER THE ERROR FLOOR

CROSS REFERENCE TO RELATED APPLICATIONS

The present application is a continuation of U.S. patent application Ser. No. 09/865,958 filed May 25, 2001, now U.S. Pat. No. 6,810,502, which is a continuation-in-part of U.S. patent application Ser. No. 09/492,962 filed Jan. 28, 2000, now U.S. Pat. No. 6,606,724, both of which are hereby incorporated by reference herein as though set forth in full.

FIELD OF THE INVENTION

The present invention relates generally to communication systems and iterative decoding performance. A method and apparatus for decoding the serial concatenation of multiple external code blocks with serially concatenated block- and convolutional-coded data is presented. An example of how these concepts may be applied to parallel concatenated codes is also presented.

BACKGROUND

Communication systems are often limited in terms of transmitter power and spectrum availability. For these and other reasons, it is often a goal of digital communications design to maximize the transmission bit rate R and minimize the probability of bit error, or Bit Error Rate (BER), for a given system power S, and bandwidth B. The minimum bandwidth (BW) required to transmit at rate (R) is known to be Rs/2, where Rs is the symbol rate. A limit on the transmission rate, called the system capacity, is based on the channel BW and the signal to noise ratio (SNR). This limit theorem, also called the Shannon Noisy Channel Coding Theorem, states that every channel has a channel capacity C which is given by the formula, $C=BW \log_2 (1+SNR)$, and that for any rate $R<C$, there exist codes of rate $R_c$ which can have an arbitrarily small decoding BER.

For some time, the digital communications art has sought a coding/decoding algorithm which would reach the Shannon limit. Recently, coding/decoding schemes, called "Turbo Codes," have been determined to achieve fairly reliable data communication at an SNR that is very close to the Shannon Limit for modulation constrained codes.

One form of turbo decoding operates upon serial concatenated codes. Not all of such serially concatenated codes are iteratively decoded in practice, however. As an example, a serial concatenation of an outer, block code—such as a Reed Solomon code—and an inner, convolutional code, can be found in many communications and data storage applications requiring very low bit error rates. This type of serial concatenation is used, for example, in DBS (Direct Broadcast Satellite) standards. However, in practice, this serial concatenated code is not iteratively decoded.

One such serial concatenated system 100 is illustrated in FIG. 1. The serial concatenated system 100 includes a transmitter portion 102 for communicating encoded information to a receiver portion 104 via a communication channel 106. The transmitter portion 102 uses an outer code encoder or block encoder 108 (e.g., a Reed-Solomon encoder) to encode input bits. The output of the outer code encoder 108 is then provided to an interleaver 110 wherein the signal bit order is shuffled in a predetermined manner. Next, the output of the interleaver is provided to an inner code encoder (e.g., convolutional encoder) 112. The output of the inner code encoder 112 is then sent to a bit-to-constellation mapper, modulated by modulator 114 and transmitted over the communication channel 106 to the receiver portion 104 for decoding and processing.

Once demodulated by demodulator 116, the classical approach for decoding a serial concatenated system 100 is to apply a soft-decision inner code decoder (e.g., Viterbi decoder) 118 that receives as inputs soft symbols and outputs hard bit estimates for the inner block code. The outputs of the inner code decoder 118 are then byte-deinterleaved by deinterleaver 120 and provided to an outer code decoder 122 (generally a block decoder such as a Reed-Solomon decoder) that can correct multiple byte errors in a block. If the outer code decoder 122 indicates that the number of errors is beyond its correction capability, it may indicate so and no corrections are made.

In effect, this classical approach to concatenated decoding decomposes the task into two independent procedures: one for the inner code, and another for the outer code. An "optimal" decoder is then selected and applied for each of these procedures. However, although each decoder may be optimal for its specific task, the overall composite system may not be optimal for a given concatenated code. This is because (1) the Reed-Solomon decoder uses hard- rather than soft-decision data, and (2) the Viterbi decoder performance could be improved in a second pass decoding operation. In particular, error bursts, which are observed in the first-pass decoding, could be broken up by using the bit decisions from blocks which were successfully decoded by a Reed-Solomon decoder. This operation would, in turn, impact a second-pass Reed-Solomon decoding of the data, perhaps enabling the Reed-Solomon decoder to correct another block that previously was considered uncorrectable. In principle, the sharing of outer-to-inner code decoding information could be re-iterated, resulting in even further improvements. In fact, this technique is similar to turbo decoding in a parallel or serial concatenated code context, with bit-by-bit maximum a posteriori probability (MAP) decoding.

Various iterative (turbo-like) decoding approaches have been used in simulation to decode serial concatenations of convolutional and Reed-Solomon codes. One problem in such decoding processes is determining how the Viterbi algorithm is to be modified to accommodate inputs from Reed-Solomon decoded blocks that are correct. One attractive approach involves finding a method that efficiently forces a Viterbi decoder to constrain certain locations in a data record to desired output logic levels.

As previously indicated, the aforesaid serial concatenation of a Reed Solomon and a convolutional code can be iteratively decoded. However, better results are achievable if the component codes are specifically designed with the iterative decoding process in mind. 'Turbo codes' are examples of such codes.

A limitation of conventional turbo decoders is the inability to reach very low bit error rate (BER) floors; this inhibits their broad application to video transport, which requires very low BERs. One approach employed in the art to try to reduce the BER floor has been geared towards choosing good codes and topologies. These approaches try to make more efficient the already existent methods of trying to perform turbo decoding, but sometimes practical implementations that achieve the desired level of performance are difficult to find. For this reason, the serial concatenation of an additional, external decoder, such as a Reed-Solomon decoder, is sometimes used in an attempt to drive the BER floor lower. For some applications, whereby only the turbo code is used, one may not be able to achieve sufficiently low BER floors as desired or required within a given application.

Further limitations and disadvantages of conventional and traditional systems will become apparent to one of skill in the art through comparison of such systems with the present invention as set forth in the remainder of the present application with reference to the drawings.

SUMMARY OF THE INVENTION

Various aspects of the present invention can be found in a turbo decoder that employs iterative decoding, and additionally employs a turbo code-external 'external decoder' in the iterative decoding process. This external decoder may be a decoder for an error detection code, such as a block Cyclic Redundancy Check (CRC) code, or a block algebraic error correction code, such as a Reed Solomon or BCH code. Multiple external code "sub-blocks" (upon which the CRC or Reed Solomon decoder operate upon) exist within a single block being decoded by the turbo decoder.

Other aspects of the invention can be seen in a conventional serial concatenation of a convolutional code with a Reed Solomon or similar algebraic decoder. In fact, the role and utilization of the Reed Solomon, or 'other similar algebraic coder' is analogous to the external decoder within the turbo decoder application. The only difference is that the 'external code' is married with a turbo code in the turbo code application; whereas, the 'external code' is married with a convolutional code in the conventional serial concatenation case.

The invention involves the feedback of high-confidence 'correct' hard decisions from an external decoder to the turbo decoder (or convolutional decoder). More importantly, it outlines techniques by which information concerning these high confidence decisions may be imposed as constraints and thereby exploited within the turbo decoder (or convolutional decoder).

The feedback from the external decoder is employed within one or both of the inner and/or the outer decoder (SISO) of a serial turbo concatenated code—or the inner code of a conventional concatenated code. The method for employment for this feedback information within the SISOs may involve one or both of decision-forcing and/or input data overloading. Decision-forcing may be characterized as a method that renormalizes selective state metrics so that the decoder is prohibited from considering undesired decision outcomes. Input data overloading may be characterized as muxing input data with extreme values, so that this data can be overwritten in selected locations, and thereby influence the decoder to favor desired decision outcomes. Moreover, various aspects of the invention are applicable to areas beyond those of serially concatenated codes. One such extension includes their application using a parallel concatenated code.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

In addition, throughout the various drawings, those lines that are dashed include optional items. The operation of the various items, signals, and elements that are represented by such lines may be included in the embodiment shown, or they may be omitted without impeding the operation of aspects of the invention.

FIG. 11A is a system diagram illustrating an embodiment of a serial concatenated code turbo decoder that feeds back external decoding information to an outer SISO.

DETAILED DESCRIPTION

One example of digital video processing is that employed using the motion picture expert group (MPEG) standard. In the MPEG standard, a block consists of 188 bytes of data. In one embodiment of the present invention, the turbo decoding system operates on nominally 10 MPEG blocks of source data in a turbo decoder frame. A cyclic redundancy check (CRC) check is contained within each of these MPEG blocks. One purpose of the CRC check is to ensure that the MPEG decoder has advance knowledge of whether the bits that it is receiving are correct or not. A turbo decoder operable in accordance with the present invention is able to take advantage of the redundancy of the CRC to further improve the decoding performance. During iterations before the final iteration, this improvement in decoding performance is achieved.

From one perspective, when a block covered by a CRC (henceforward, a "CRC block") decodes correctly, it may be assumed with a relative high degree of certainty that this particular segment of the decoded data is known with a very high probability. The turbo decoder then may use this knowledge to assign a very high confidence level to that segment of data. The turbo decoder can then feed this data back to an inner decoder and also to an outer decoder in its next iteration. By doing this, the decoding performance of the next iterative pass is improved. Since the inner decoder uses interleaved or order-scrambled versions of the outer decoded bits, the increase in performance can be significant. The reason for this is that the high confidence bits are scattered throughout an inner decoded frame, and can thereby influence the decoding of the bits surrounding them, in subsequent decoding iterations.

While the MPEG encoded video data is one type of video data that may have CRC checks, any other type of data having such redundancy will also benefit from the present invention. The present invention is operable to augment the performance of any other turbo decoder solution borrowing on the additional redundancy of bits intended for an error detection (or error correcting) function. This will enhance decoding performance and drive down a bit error rate (and lower the BER floor) beyond solutions that do not involve external codes (such as CRCs) within the iterative decoding process.

The present invention is geared and very effective to lower the BER floor—i.e., the region in the turbo decoder BER characteristic that flattens, or saturates. In the floor regions, the BER is already very low. Since there is already a high likelihood that the data are error free, some blocks of bits, covered by CRC block checks, for example, are likely to be 'clean.' Fortunately, it is precisely in these low BER regions where a reduction in BER floor is needed, and the present invention will perform best. It requires that some of these blocks are, indeed, 'error free.'

Figure 1:
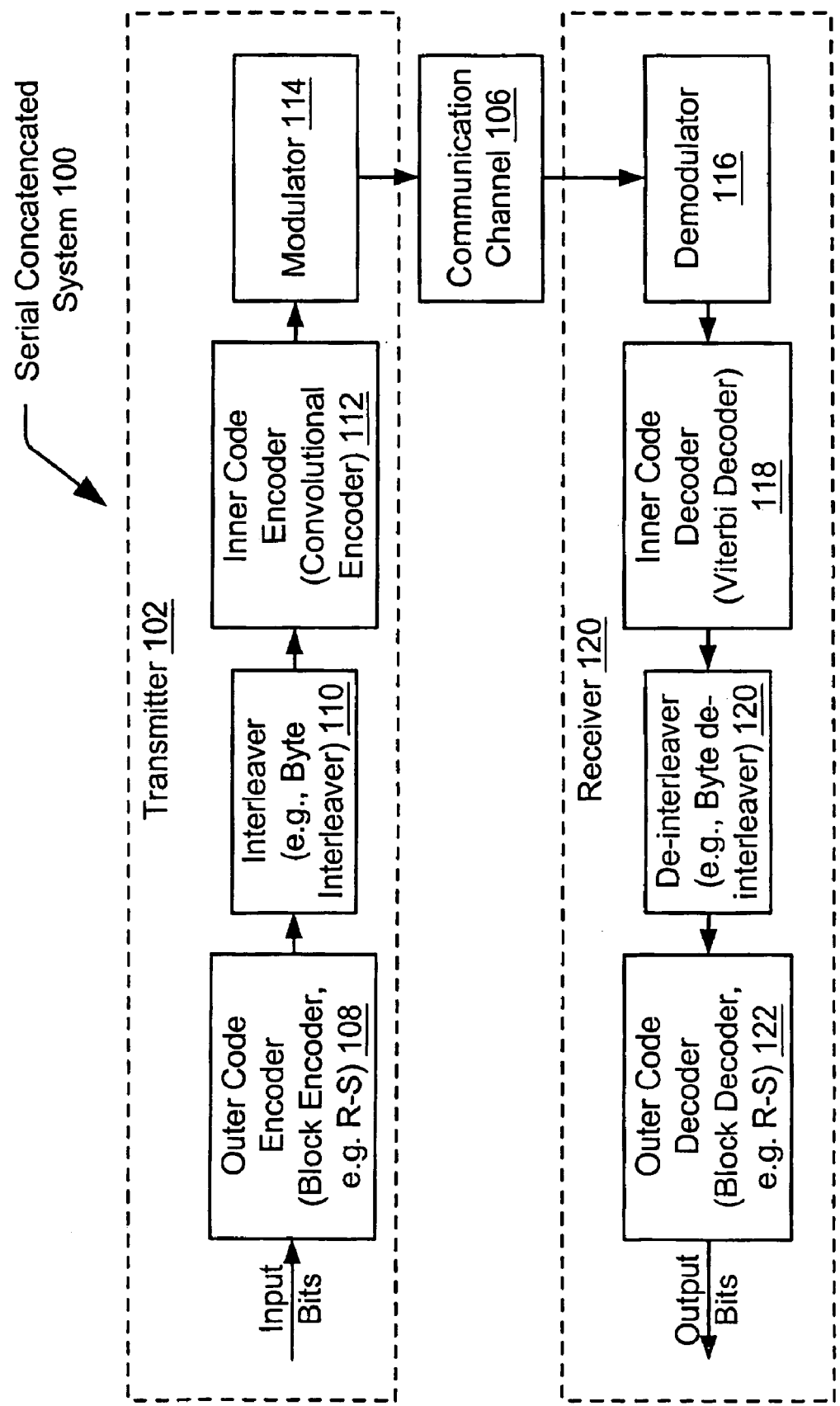
FIG. 1 is a schematic diagram of a conventional Serial Concatenated Coding system.
Figure 2:
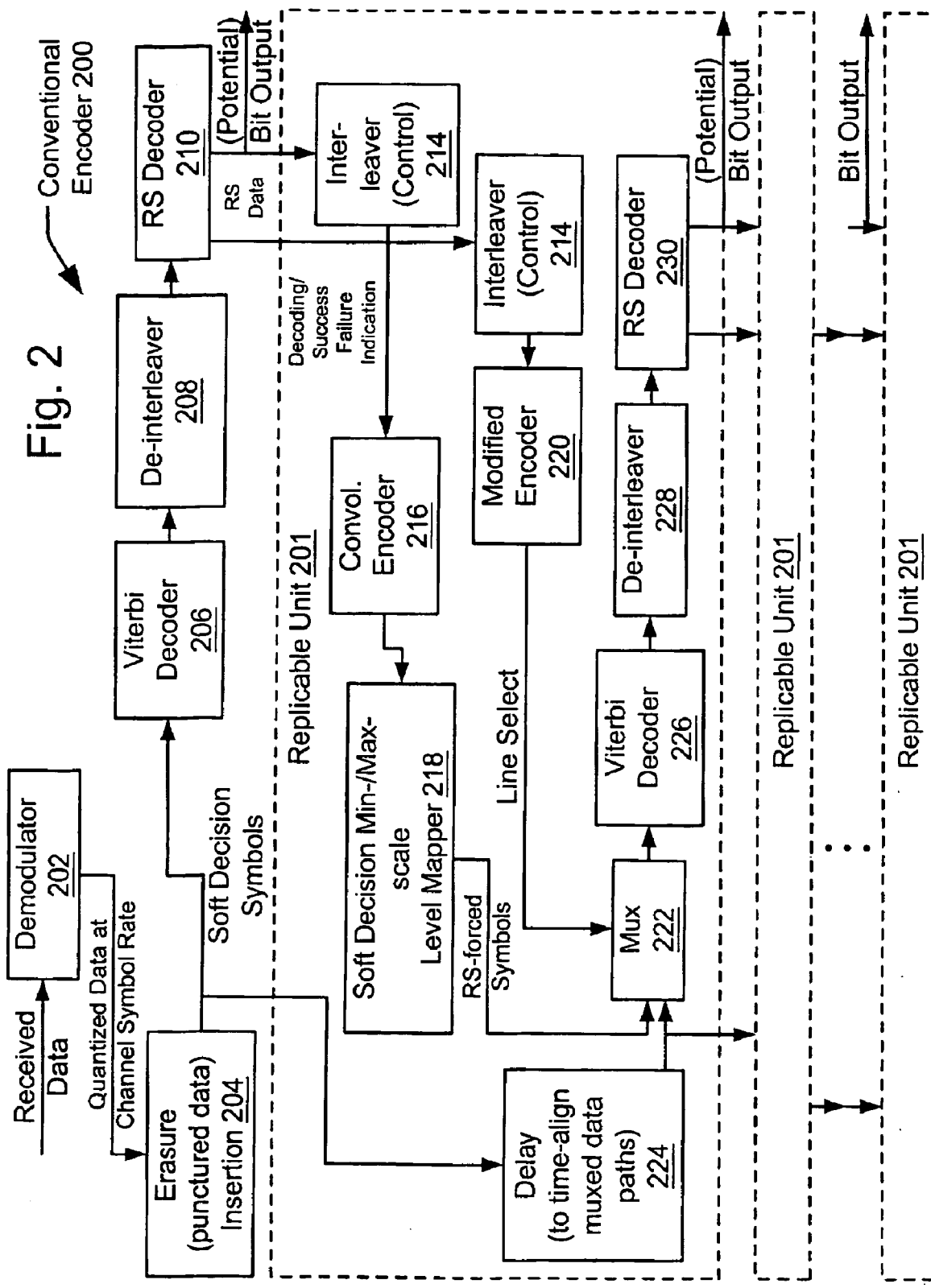
FIG. 2 is a schematic diagram of an exemplary communications system (involving iterative decoding of the serial concatenation of an inner convolutional code and outer Reed Solomon code) built in accordance with the invention.

FIG. 2 is a schematic diagram of an exemplary communications system (involving iterative decoding of the serial concatenation of an inner convolutional code and outer Reed Solomon code) built in accordance with the invention. The communications system includes a receiver 200 comprising at least one pipeline decoder unit 201. As will be appreciated, the pipeline decoder unit 201 includes decoding functionality that efficiently utilizes inputs from previously decoded blocks to improve receiver performance and coding gain.

One obstacle to direct VLSI implementations of iterative concatenated decoding is the required processing speed. For example, if serial data is input at 20 Msymbols/sec, and four iterations are desired, the Viterbi and Reed-Solomon decoders must operate at four times the symbol rate (80 Msymbols/sec)—if the streaming data is to be processed in real time. With the disclosed pipeline approach, however, the processing speed of elements in the pipelined datapaths does not need to be increased with respect to those found in a classical concatenated decoder.

Referring more particularly to FIG. 2, received data is first demodulated by a demodulator 202 to produce quantized data symbols, called 'soft-decision symbols,' delivered at the channel symbol rate. This soft decision symbol data may then be provided to an erasure insertion circuit 204, in which an erasure is inserted, before the first decoding pass, at the point where the symbol was punctured by the transmitter. Puncturing coded encoder outputs is acceptable for transmission purposes because of the redundancy of information that is created within typical encoders. As discussed in greater detail below, the pipeline decoder units 201 may be advantageously isolated from puncture-specific procedures.

The soft-decision symbols provided by the erasure insertion circuitry 204 are first decoded by an inner or first decoder 206 (e.g., a Viterbi or other convolutional decoder, or a TCM decoder), to produce first decoded data. The first decoded data is then deinterleaved by a deinterleaver 208 prior to provision to an outer or second decoder 210 (e.g., an algebraic and/or block decoder such as a Reed-Solomon decoder).

The Reed-Solomon decoder 210 has two outputs, which are provided to the first pipeline decoder unit 201: the actual bits of a decoded Reed-Solomon block, and a decode status signal output that indicates whether an associated Reed-Solomon block was decoded without error. The Reed-Solomon decoding status signal is replicated for each Reed-Solomon bit, forming a stream of status bits. In the disclosed embodiment, the Reed-Solomon data bits are provided to a data interleaver 212 of the first pipeline decoder unit 201, while the decode status bits are interleaved by a control interleaver 214. The data interleaver 212 and control interleaver 214 function to spread the status and data bits over multiple Reed-Solomon blocks of data. The data interleaver 212 preferably functions in a manner similar to the interleaver used by the transmitter to generate the serial concatenated data received by the receiver 200.

After interleaving, the Reed-Solomon data bits are re-encoded by convolutional encoder 216 to form encoded outputs. Again, the convolutional encoder 216 preferably functions in a like manner to the inner decoder used by the transmitter to produce the serial concatenated code data. As discussed more fully below in conjunction with FIG. 4, a similar encoding process is performed on the interleaved status bits by a "modified encoder" 220, such that a Viterbi or third decoder 226 can determine whether or not data bits produced by the convolutional encoder 216 evolved entirely from reliable Reed-Solomon-decoded blocks.

The Viterbi decoder 226 of the pipeline decoder unit 201 of the disclosed embodiment of the invention is configured to behave in a like manner to a MAP sequence decoder when provided with high-reliability data from successfully decoded Reed-Solomon blocks. In particular, the binary "hard-decision" data provided by the convolutional encoder 216 is provided to a soft-decision minimum-/maximum-scale level mapper 218, which functions to produce highly reliable soft-decision data. For example, a logic level "0" may be mapped to a minimum-scale soft-decision value (e.g., 0000 with 4-bit unsigned binary quantization), and a logic level "1" mapped to the maximum-scale soft-decision value (e.g., 1111 with 4-bit unsigned binary quantization). Next, the "mapped" datastream (or Reed-Solomon-forced decision symbol data) is time-aligned with the soft-decision symbol data produced by the erasure insertion circuitry 204. The temporal alignment is provided by delay circuitry 224. The time-aligned datastreams are then provided to the parallel inputs of multiplexing circuitry 222.

The multiplexing circuitry 222 receives the output of the modified encoder 220 as a control signal to selectively determine which of the datastreams to provide to the third decoder 226. When Reed-Solomon forced-decision symbol data is available from a successfully decoded Reed-Solomon block, the multiplexing circuitry 222 passes that data to the third decoder 226. When the incumbent "mapped" element is from a failed Reed-Solomon block, the multiplexing circuitry instead passes the delayed soft-decision symbol data from block 224 to the third decoder 226. The third decoder 226 decodes the output of the multiplexing circuitry 222 to provide "pipelined" decoded data characterized by having a smaller bit error rate than the decoded data provided by the first decoder 206. In particular, the third decoder 226 benefits from the entire concatenated coding gain of the first decoding pass.

The output of the third decoder 226 is next deinterleaved by deinterleaver 228, whose output is provided to a fourth/Reed-Solomon decoder 230. As with the Reed-Solomon decoder 210, the Reed-Solomon decoder 230 of the pipeline decoder unit 201 may include both a decoded data datastream, as well as a decode status signal datastream. These datastreams, as well as the output of the delay circuitry 224, may be provided to an additional pipeline decoder unit 201.

It is contemplated that any number of additional pipeline decoder units 201 may be similarly utilized until the desired coding gains and BER is achieved. In another contemplated embodiment of the invention, the clock rate for the decoder 200 could be increased and additional multiplexing circuitry provided such that the first decoder 206 could be leveraged to perform the function of the third decoder 226. Similarly, the second decoder 210 could be reused to perform the function of the fourth decoder 230. By using an appropriate clocking scheme, additional "pipelined" iterations could be performed by the first decoder 206 and the second decoder 210. In this manner, the hardware overhead associated with the disclosed received 200 may be reduced.

Although the illustrated receiver 200 makes use of a convolutional inner code and an algebraic or Reed-Solomon outer code, it is contemplated that a decoder according to the present invention may be adapted to utilize TCM codes and/or other types of block codes.

Figure 3:
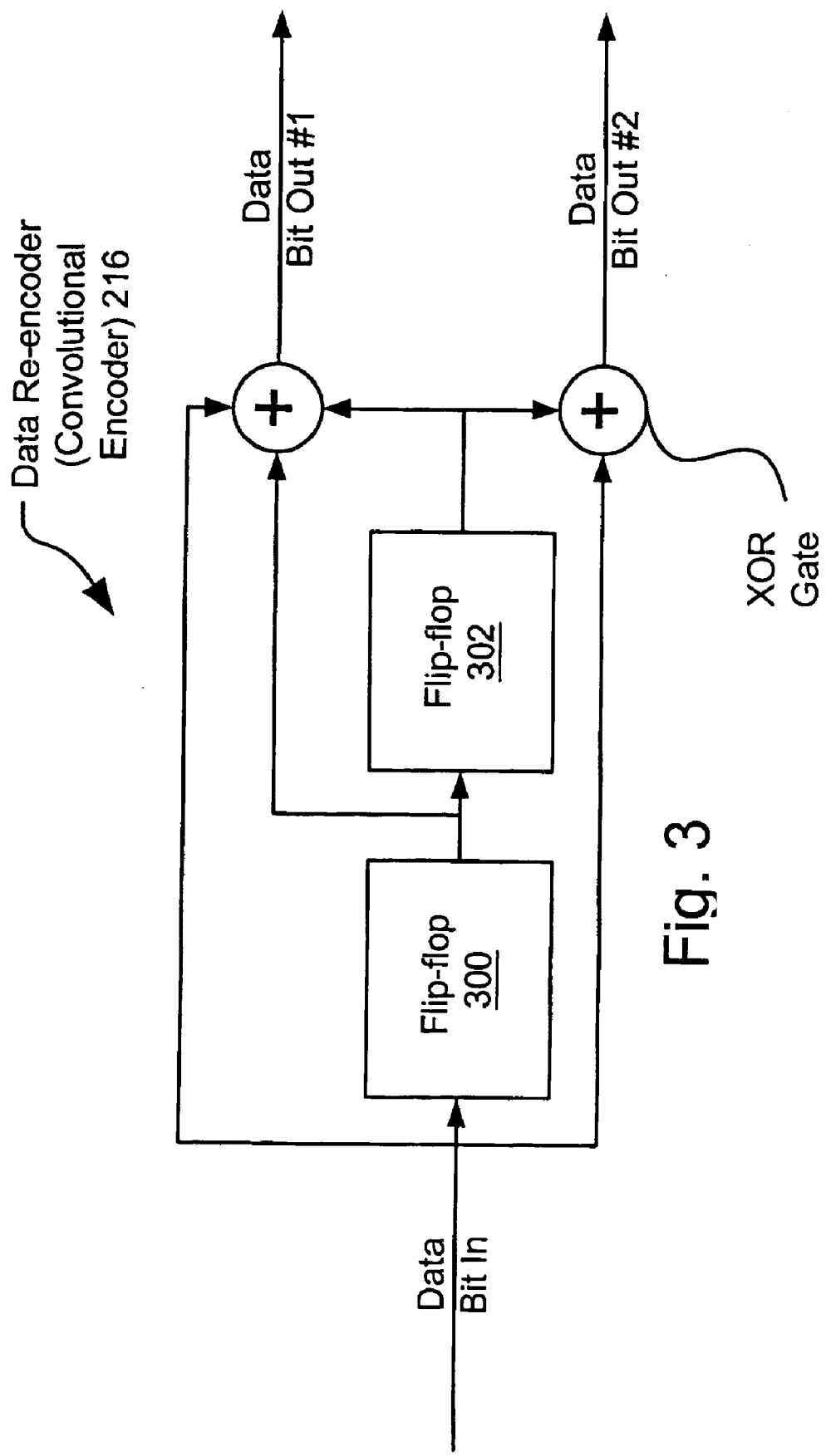
FIG. 3 provides exemplary details of a convolutional encoder for inner encoding data in the communication system of FIG. 2.

FIG. 3 provides exemplary details of a convolutional encoder 216 for inner encoding data in the communication system of FIG. 2. The convolutional encoder 216 receives a continuous sequence of data input bits that are mapped into a continuous sequence of encoder data bit outputs. The convolutional encoder 216 comprises a finite state shift register formed of series-connected flip-flops 300 and 302. In accordance with conventional encoder architectures, the data inputs bits, as well as the outputs of each of the flip-flops 300 and 302 are provided to a first exclusive OR (XOR) gate 304. The XOR gate 304 produces a first data bit output. The data bit inputs are likewise provided to a second XOR gate 306, which also receives the output of the flip-flop 302. The second exclusive OR gate 306 produces a second data output bit. As will be appreciated, the first and second outputs of the convolutional encoder 216 relate to a rate ½ code, and these outputs may be converted from a parallel format to a serial format via a converter (not shown).

Figure 4:
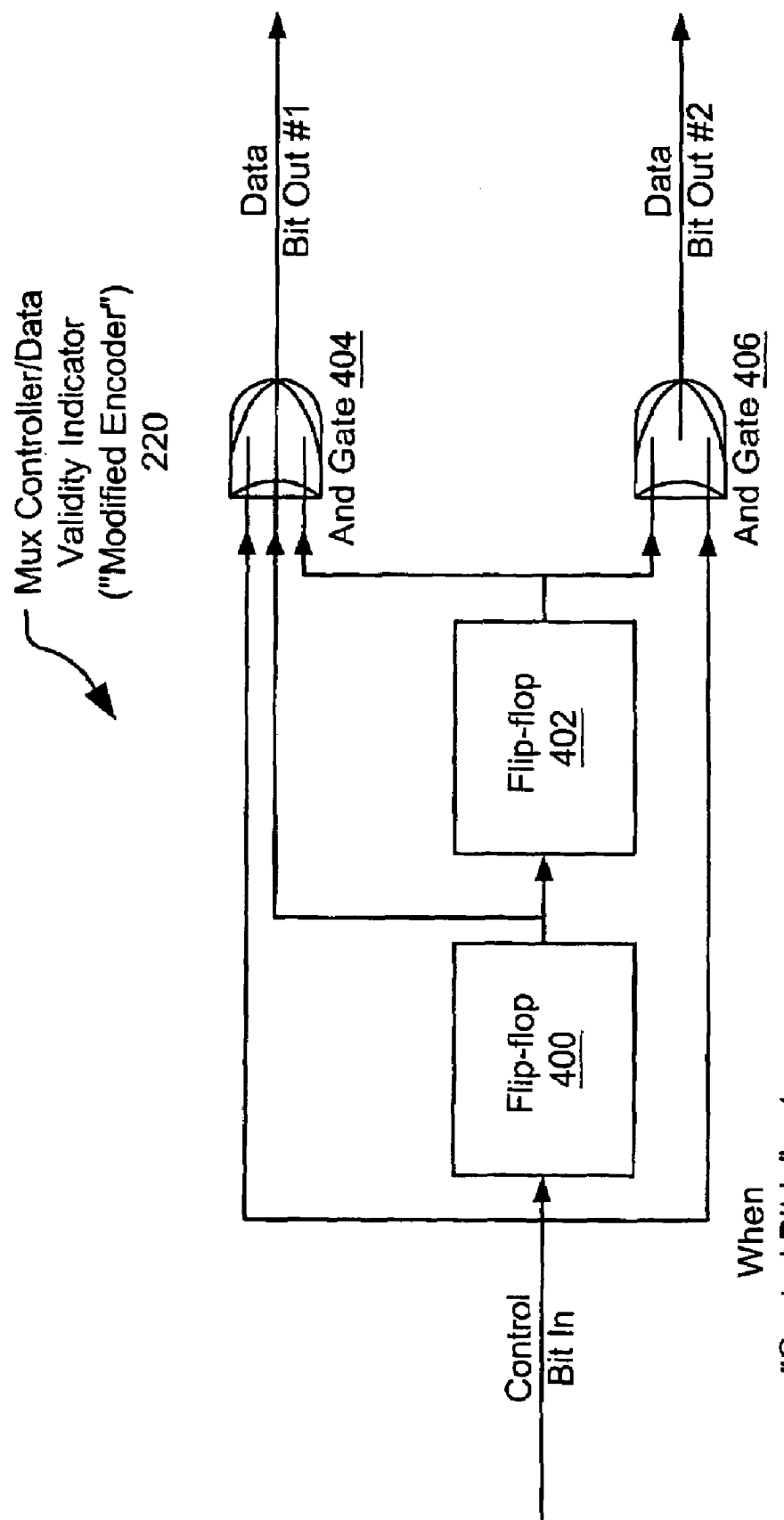
FIG. 4 provides exemplary details of a modified encoder for encoding data status information for use by the communication system of FIG. 2.

FIG. 4 provides exemplary details of a modified encoder 220 for encoding decode status signals generated by an outer decoder 210. The modified encoder 220 structurally resembles the convolutional encoder 216, with the exception that the XOR gates 304 and 306 in the convolutional encoder 216 are replaced by AND gates 404 and 406. The incoming decode status signal/control bits, as well as the outputs of flip-flops 400 and 402 are provided to the three input AND gate 404, which produces a first control bit. The decode status signals and the output of the flip-flop 402 are provided to the two input AND gate 406, which produces a second control bit. This arrangement is advantageous because when the output of the convolutional encoder 216 has no dependency on input data that is invalid, the modified encoder 220 signals that the output is valid. This is true even if the code in question may have shift register entries which are invalid but not accessed, as is the case for the control bit produced by AND gate 406. As previously discussed, the outputs of the modified encoder 220 may be used to control the multiplexing circuitry 222, which determines whether the re-encoded data is used.

As illustrated in the disclosed embodiment of the invention, the symbols erased by puncturing (at the transmitter) are inserted before the first decoding pass. Thus, decoding operations performed by the pipeline decoder unit(s) 201 need not perform puncture-specific procedures. Instead, the pipelined decoder unit(s) 201 can be configured to operate as fixed-rate devices (with the possible exception that the trace back length in the Viterbi decoder(s) 216 may be lengthened for optimal decoding performance when punctured data is present). It is also noted that in secondary decoding passes, the erased data that was re-inserted does not necessarily remain indeterminate (i.e., somewhere between a logic level "1" and "0") as it was when initially inserted. If the re-inserted data arises from a bit that was correctly decoded in a Reed-Solomon block evaluation, then its value is known with very high probability. Thus, it is possible to correctly infer the value of untransmitted punctured bits and use this information in all subsequent decoding passes. This enhances the performance of the receiver 200 in high data rate applications involving puncturing.

In the disclosed embodiment of the invention, the Viterbi or third decoder 226 of the pipeline decoder unit 201 is described as utilizing forced decision data, which forces the third decoder 226 to behave much like a MAP sequence processor. Although not precisely a MAP solution, the approximation is such that there is no discernible difference in the disclosed implementation (at high code rates, where the amount of puncturing is significant). The actual MAP solution is to not allow any transition from trellis states which would result in a Viterbi decoder outputting a result which is contrary to what a Reed-Solomon decoder has indicated as the desired output.

In this contemplated embodiment of the invention, the described approximation functions in part because of an implementation of a four-bit soft-decision Viterbi or third decoder 226 requiring only five-bit path metrics for minimal implementation loss. For a rate ½ code, two 4-bit symbols are used to form a branch metric, and these in turn are added to a previous path metric to form an updated path metric. The two maximum-scale four-bit inputs (which are forced using the disclosed mapping approach) add up to five bits, and this in turn is added to a previous path metric. So, in this embodiment, as long as the path metric registers saturate, encoder "forcing" is equivalent to forcing the unfavored path metrics to extreme five-bit worse case values, similar to what a MAP processor, having perfect knowledge of a source bit decision, might do.

Figure 5:
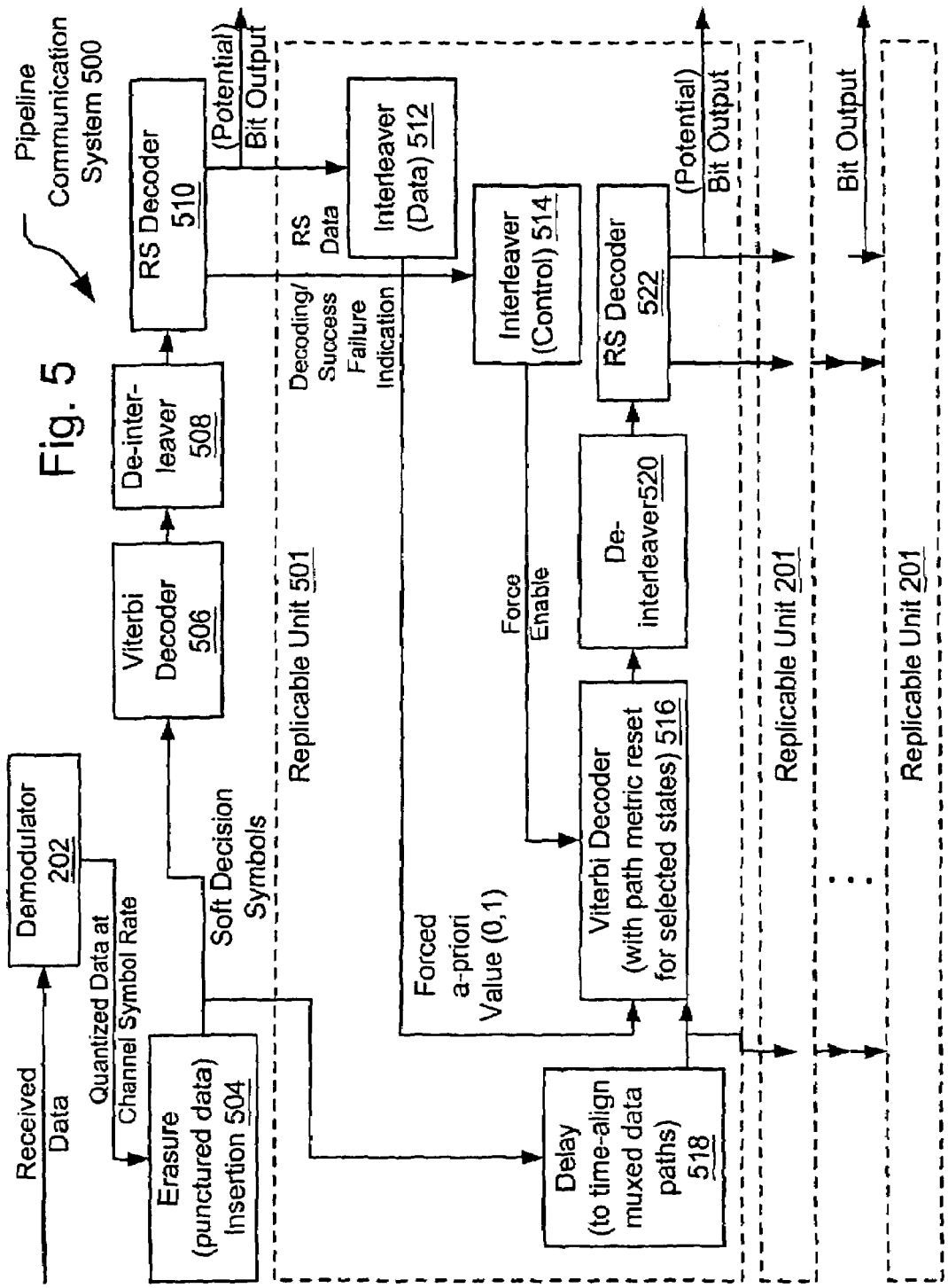
FIG. 5 is a schematic diagram of an alternate embodiment of a pipelined communications system according to the present invention.

FIG. 5 is a schematic diagram of an alternate embodiment of a pipeline communication system according to the present invention. In this embodiment of the invention, a receiver 500 includes demodulation and decoding elements 502-510 functioning in a like manner to demodulation and decoding elements 202-210 of FIG. 2. The receiver 500 also includes at least one pipeline decoder unit 501 employing a data interleaver 512 and a control interleaver 514 (functioning in a like manner to data interleaver 212 and control interleaver 214 described above).

In this embodiment of the invention, the outputs of the data interleaver 512 are provided directly to a Viterbi decoder 516 as forced a-priori values. The Viterbi decoder 516 resets selected path metrics in order to force a-priori decision values, in an indirect manner. To be more precise, the Viterbi decoder resets a path metric to an undesirable value if such a path would result in a decision outcome that is contrary to the desired (forced 'a priori') outcome. By doing so, undesired outcomes are greatly disfavored during the decoding process. This effectively 'forces' desired decoding outcomes, in an indirect manner. The decode status signals provided by the control interleaver 214 are also passed directly to the Viterbi decoder 516 to selectively constrain the output of the Viterbi decoder 516 to be based on either the forced 'a priori' values or a delayed version of the demodulated serially concatenated code data provided by delay circuitry 518. The output of the Viterbi decoder 516 is provided to a deinterleaver 520 and second outer decoder 522 operating in an analogous manner to deinterleaver 228 and fourth decoder 230 of FIG. 2.

In one contemplated embodiment of the aforedescribed path resetting technique, applied to a rate 1/n nonsystematic convolutional code, if the number of memory elements in a code is m (resulting in $2^m$ states), and it is desired to force a logic level "0" at the output of the third decoder 226 for a given node, then the top $2^{m-1}$ state (path) metrics are not altered, while the bottom $2^{m-1}$ state (path) metrics are set to the most unfavorable path metric. In this manner, the next state at the output of the third decoder 226 will be a logic level "0". Similarly, to force a logic level "1", the top $2^{m-1}$ state metrics are set to the most unfavorable path metric. This procedure describes the decoding of rate 1/n nonsystematic (feedforward shift register-type input) convolutional codes, such as the one illustrated in FIG. 3. As will be appreciated, in this embodiment it is not necessary to reinsert erasures into punctured data positions using this technique. Analogous techniques (e.g., a look-up table to indicate which transitions force logic levels of zeros, and which other transitions force logic levels of ones) using the same concept of selective path metric resetting can be devised for other types of codes (e.g., systematic codes, or rate k/n codes, where k and n are integers larger than one) without departing from the spirit of the invention.

Thus, a communication system has been described for accelerating signal decoding and increasing receiver performance in a conventional serial concatenated (convolutional code plus Reed Solomon code) coding environment. The communication system utilizes a pipelined architecture to provide recognizable increases coding gains, even at high data rates, without increasing the speed of decoding elements in pipelined datapaths.

As is forthwith demonstrated and described below, similar techniques may be applied to turbo codes having an additional, external code—an external code that might have initially been intended only to detect the presence of decision errors within blocks at the turbo decoder output.

Figure 6:
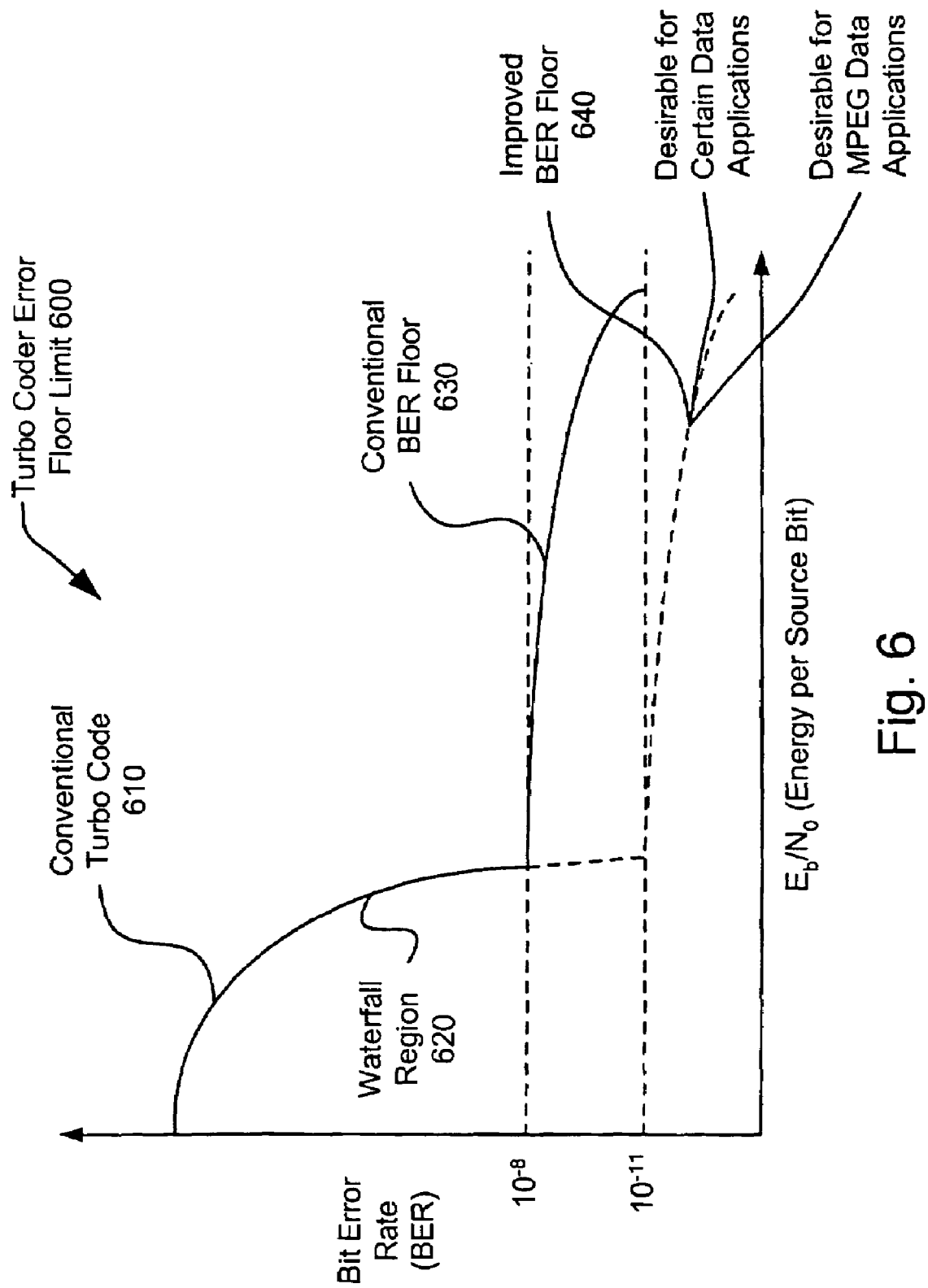
FIG. 6 is a diagram illustrating a turbo decoder bit error rate (BER) versus energy per source bit (E.sub.b/N.sub.0) characteristic.

FIG. 6 is a diagram illustrating a turbo decoder bit error rate (BER) versus energy per source bit ($E_b/N_o$) characteristic 600. This characteristic 600 illustrates both a conventional bit error rate floor region 630 and an improved bit error rate floor region 640. The BER of a conventional turbo code 610 decreases as the energy per source bit increases; however, the rate of BER decrease is qualitatively different, in different $E_b/N_o$ regions. The region of most steep decrease of the conventional turbo code BER characteristic 610 is commonly referred to as the waterfall region 620. The region of relative flattening is commonly referred to as the bit error floor region 630. In conventional turbo coders, a conventional BER floor 630 might be located at a BER of approximately $10^{-8}$. Those having skill in the art will recognize that the BER floor 630 that approaches approximately $10^{-8}$ is simply exemplary of just one embodiment of the invention. The BER may vary anywhere from $10^{-4}$ to $10^{-16}$, depending on a number of elements and design considerations including the length and type of interleaver, the choice of component codes and code rates, and the modulation being used. However, when employing turbo coding in accordance with the present invention, the BER may be lowered. For example, one might have a BER floor at $10^{-9}$, and desire to push this down to $10^{-11}$; this invention might aid in realizing this goal.

While the qualitative response of the improved BER floor 640 follows a similar response as the conventional BER floor 630, it is clear that the improved BER floor 640 is significantly lower than the conventional BER floor 630. One particular application where high BERs is problematic is within video applications. Many video applications require BERs in the range between $10^{-9}$ and $10^{-12}$. Many conventional turbo coders simply do not offer these lower BERs using current technology and reasonable interleaver sizes, whereas the present invention offers the promise of lowering the BER of a turbo coder without increasing its interleaver depth. It is within the regions beyond the waterfall region 620, where the BER is already very low, but saturates (rather than continuing to drop at a precipitous rate of descent), that use of a conventional turbo decoder is problematic. The present invention addresses, among other things, this deficiency in the conventional turbo decoder art.

A convolutional encoder, such as the convolutional encoder of the FIG. 3, can be further improved upon by employing decision forcing to achieve a more effective system. Several examples of methods to perform decision forcing in accordance with the invention are described and shown below.

Figure 7A:
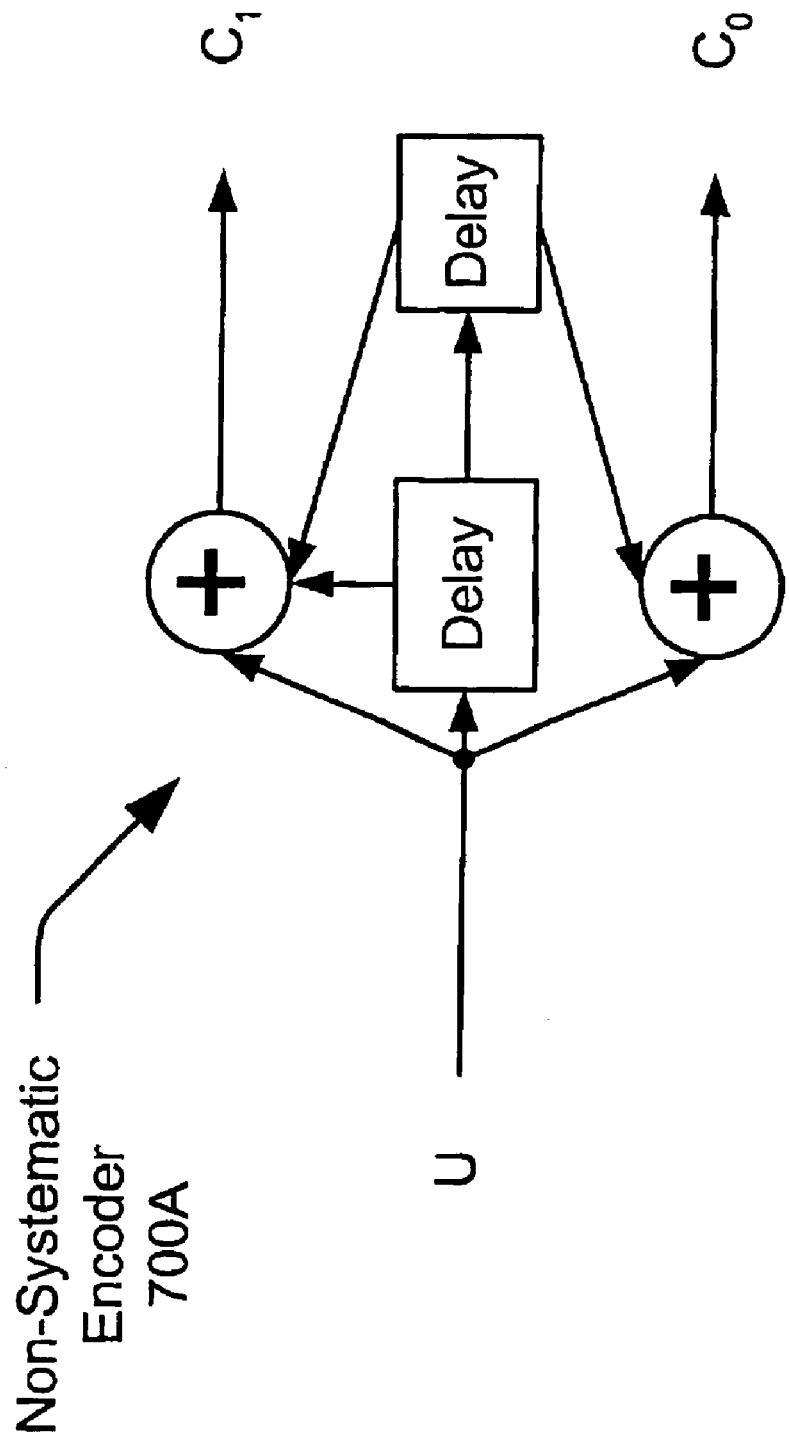
FIG. 7A is a functional diagram illustrating an embodiment of a nonsystematic encoder.

FIG. 7A is a functional diagram illustrating an embodiment of a non-systematic encoder 700A operating in accordance with the aforesaid trellis description. The examples shown and described above using the trellis and encoder are suitable as examples to describe various aspects of the invention.

Shown within the example of the FIG. 7A, a signal "input," shown as U, is simultaneously fed to three inputs, a delay block, and two summing junctions (a top summing junction and a bottom summing junction). The two summing junctions are XOR gates and the delay block is a shift register in certain embodiments. The output from the first delay block is fed into both the top summing junction and a second delay block. The output from the second delay block is fed into both the top summing junction and the bottom summing junction. Finally, the output from the top summing junction is shown as output $C_1$, and the output from the bottom summing junction is shown output $C_0$. The non-systematic encoder 700A depicts just one example of a non-systematic convolutional encoder. Other non-systematic convolutional encoders may also be employed within various embodiments of the invention as well.

The code generated by FIG. 7A encoder is illustrative of just one of many such convolutional codes where the principle of path restriction may be applied. Many other convolution codes may be formed, and, during the decoding, certain decoding paths may be "restricted," without departing from the scope and spirit of the invention. For example, for paths that would not deliver the desired decoding outcome, the path metric for those decoding paths may be set so significantly unfavorable that there is no propagation (during final decision-making) to those paths. In one instance, where an application desires that a most significant bit (MSB) (left-most shift register in the encoder) be path restricted so the paths where the MSB is a 0 be selected in any decision-making, then the path metric for any 1 path may be set to a significantly undesirable (e.g., large) value to attempt to impede any decision based on that path. This method of path restriction in an effort to perform decision forcing is operable within the various embodiments of the invention.

While the FIG. 7A illustrates an example of path restriction, the operating principle may be extended to any degree of path restrictions. In some instances, a look up table (LUT) may be used to perform path restriction where multiple bit inputs are received within such a system. That is to say, where there are multi-bit inputs, path restriction can be performed based on any or more of the input bits.

Figure 7B:
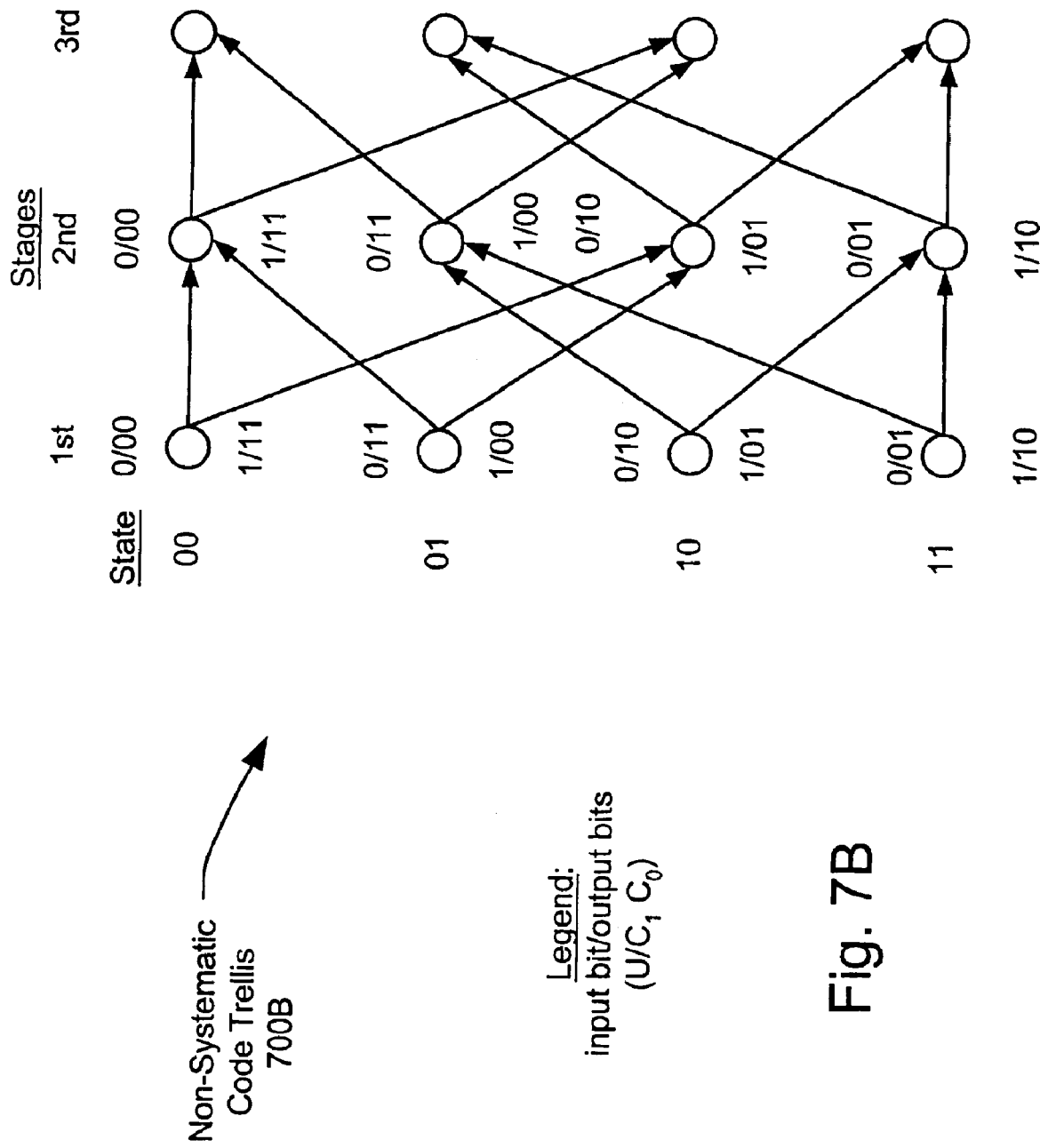
FIG. 7B is a functional diagram illustrating an embodiment of a nonsystematic code trellis.

FIG. 7B is a functional diagram illustrating an embodiment of a non-systematic code trellis 700B that would generated by the encoder illustrated in FIG. 7A. Such a trellis diagram tracks the evolution of states and encoder outputs according to encoder inputs and previous encoder states, as time progresses. Since the encoder in FIG. 7A has two memory elements, the non-systematic code trellis 700B possesses four possible states: (00, 01, 10, and 11). Since the encoder of FIG. 7A has one binary input, the trellis diagram possesses two possible inputs: (0,1). Each of the 'stages' in the trellis corresponds to an advance in time. For the various transition paths between stages, the notation within FIG. 7B uses a similar notation as that within the FIG. 7A of input bit/output bits being shown by U/$C_1$ $C_0$. The input to the encoder is the "input bit," and the output of the convolutional encoder are the "output bits."

Some examples are shown to illustrate the operation of the non-systematic code trellis 700B. For example, starting with the 00 state at the top, when a 0 is inputted, the next selected state is again 00, traversing the path designated 0/00. However, when a 1 is inputted, the next selected state is 10, traversing the path designated 1/11. In other words, when a 0 is inputted, the next state of the convolutional encoder is forced into one of the top 2 trellis states; when a 1 is inputted, the next state of the convolutional encoder is forced into one of the bottom two trellis states. Alternatively speaking, when a 0 is inputted, the next encoder state CANNOT BE one of the bottom 2 trellis states; whereas, when a 1 is inputted, the next encoder state CANNOT BE one of the top 2 trellis states.

As another example, starting with the 01 state, which is the 2nd to the top state, when a 0 is inputted, the next selected state is 00, traversing the path designated 0/11. However, when a 1 is inputted, the next selected state is 10, traversing the path designated 1/00. In other words, when a 0 is inputted, the next state of the convolutional encoder is forced into one of the top 2 trellis states; when a 1 is inputted, the next state of the convolutional encoder is forced into one of the bottom two trellis states. Alternatively speaking, when a 0 is inputted, the next encoder state CANNOT BE one of the bottom 2 trellis states; whereas, when a 1 is inputted, the next encoder state CANNOT BE one of the top 2 trellis states.

One can demonstrate the same results, assuming an initial state of 01, or 11, as well: specifically, when a 0 is inputted, the next encoder state CANNOT BE one of the bottom 2 trellis states; whereas, when a 1 is inputted, the next encoder state CANNOT BE one of the top 2 trellis states.

Since convolutional decoding (via either the Viterbi or APP decoding algorithms) is performed by operating upon path metrics, one method to force desired decoding decisions is to make the path metrics associated with the alternative, undesired decision outcomes appear highly unattractive. As the commonality in the CANNOT BE's for previous nonsystematic code illustrate, path transition decisions exhibit a structure that can be exploited. For example, with this code, if one desires to force a '0' decision, the '1' decision can be prohibited by resetting all of the path metrics associated with a transition into the bottom-half states (10 and 11) as undesirable as possible. In other words, if one desires to force a '0' decision in the transition from trellis stage 1 to trellis stage 2, then he need only reset (to 'undesirable' figures) the bottom 2 survivor path metrics (which are called 'state metrics') of trellis stage 2. This way, the top two state metrics of trellis stage 2 untouched. A similar argument, involving resetting the top two state metrics, is used when a '0' decision is to be prohibited.

One can easily show that the above 'bottom half/top half states' technique can be applied to any rate 1/n non-recursive (feedforward) convolutional code to force decisions.

Below, it is shown how decision forcing may be implemented via path prohibition for an exemplary type of recursive systematic convolutional code. Again, the principles of decision forcing are extendible to other types of recursive systematic convolutional code as well.

Figure 8A:
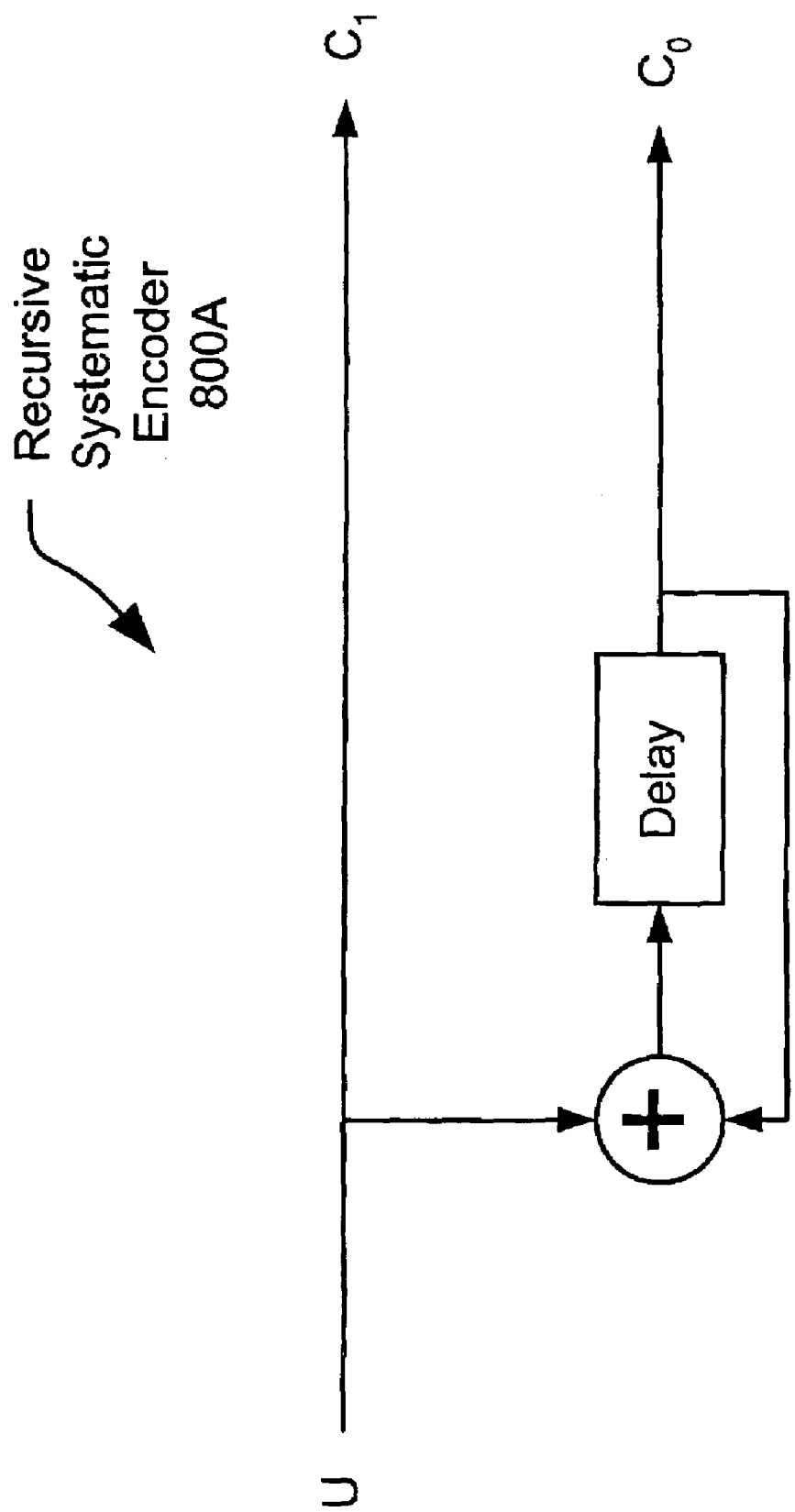
FIG. 8A is a functional diagram illustrating an embodiment of a recursive systematic encoder.

FIG. 8A is a functional diagram illustrating an embodiment of a recursive systematic encoder 800A. The recursive systematic encoder 800A is operable to perform the function of the recursive systematic code trellis 800B. An input signal, shown as U, is simultaneously fed in two directions. The actual signal of U is passed through directly as output $C_1$. In addition, the signal U is fed to a summing junction. The output from the summing junction is fed to a delay block from which the output signal $C_0$ is emitted. The output signal $C_0$ is also fed back into the same summing junction as well.

Figure 8B:
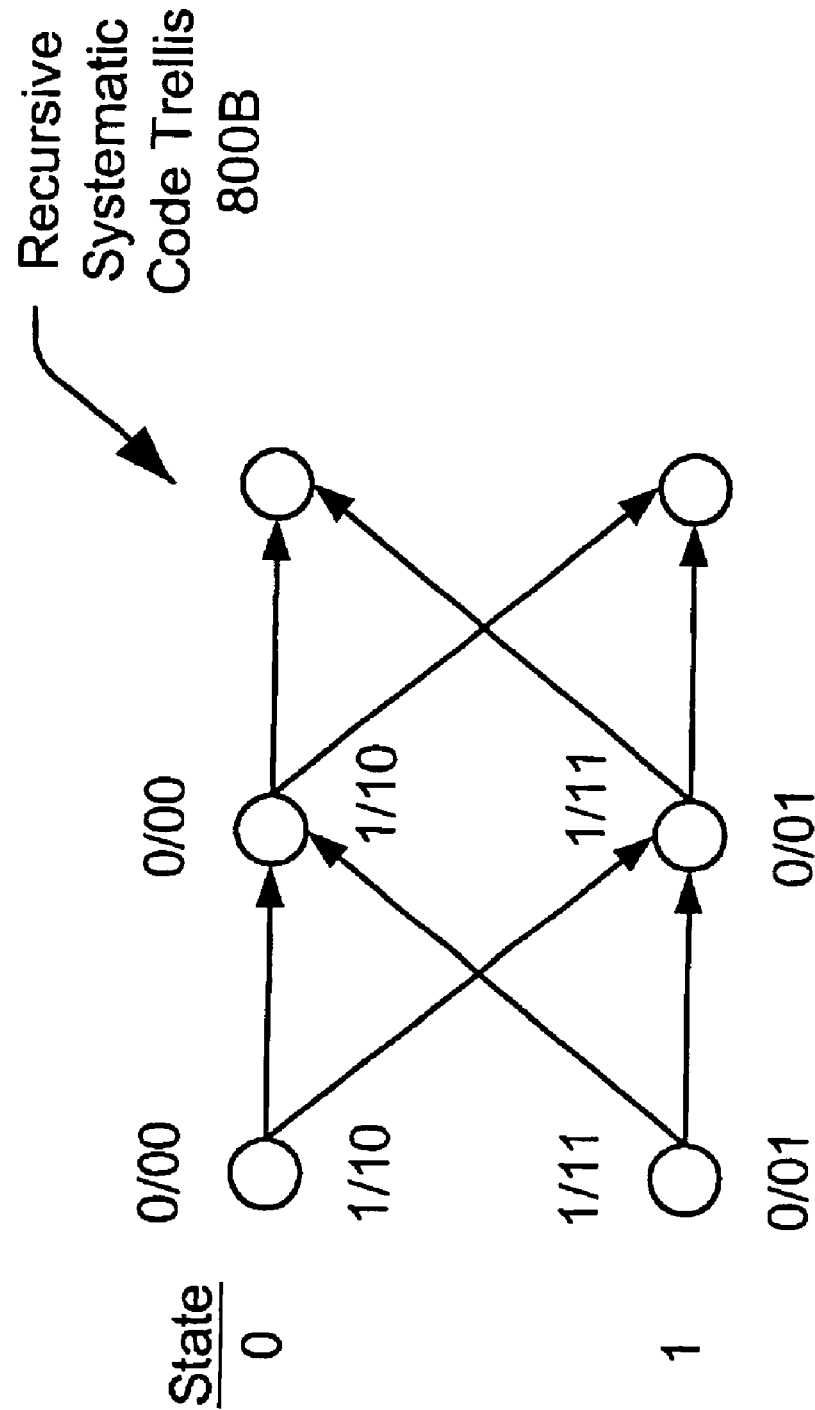
FIG. 8B is a functional diagram illustrating an embodiment of a recursive systematic code trellis.

As described above with respect to the FIG. 7A, the summing junction is operable to be an XOR gate, and the delay block is a shift register in certain instantiations as shown in the FIG. 8B. The recursive systematic encoder 800B shows an example of a single bit input in a recursive systematic encoder. However, it should be known that this is exemplary of the operation of a recursive systematic encoder; extensions to multiple bit inputs do not depart from the scope and spirit of the example, nor the scope and spirit of the application of the invention to data encoded by such encoders.

FIG. 8B is a functional diagram illustrating an embodiment of a recursive systematic code trellis 800B. The recursive systematic code trellis 800B uses two possible inputs (0 and 1) to illustrate its functionality. Again, for the various transition paths between stages, the notation within FIG. 8B uses a similar notation for input bit/output bits as shown by $U/C_1 C_0$. For the first stage, the transitions are as follows:

Starting with the 0 state at the top, when a 0 is inputted, the next selected state is again 00, traversing the path designated 0/00. However, when a 1 is inputted, the next selected state is 10, traversing the path designated 1/11.

Now starting at the left with the 1 state, when a 0 is inputted, the next selected state is 1, traversing the path 1/11. However, when a 1 is inputted, the next selected state is 0, traversing the path 0/01. For the second stage, the transitions are identical to the first stage, since the state machine dependencies are fully defined by current state and input. Again here in FIG. 8B, as with FIG. 7B, the transitions could continue indefinitely for an indeterminate number of stages.

Note that from the trellis diagram of FIG. 8B, '0' inputs leave the encoder in the same state, whereas '1' inputs push the state to cross over to the other state. Therefore, on the decoder side, when one would desire to force a '0' decision, he would prohibit crossover paths. This may be achieved by resetting the path metrics for paths that cross over states to undesirable values. Similarly, when one would desire to force a '1' decision, he would reset path metrics for paths that visit the same state to undesirable values.

Recursive systematic encoders different from FIG. 8B might have more complicated trellis descriptions, and more complicated input-to-state path mappings. In fact, FIGS. 7A, 7B, 8A, and 8B are solely illustrative of path restriction techniques that may be performed in accordance with the present invention, and those having skill in the art will recognize that any number of variations, including multi-bit input, multi-state systems, are also operable in accordance with the present invention that utilizes path restriction. In fact, the concept of path restrictions (via path metric resetting) may be used in very general cases, with the aid of a lookup table or algebraic logic (to tell the decoder which path metrics should be reset for a given desired input) without departing from the scope and spirit of the invention.

It is noted that most of the previous discussion has concerned itself with decoders which use forward recursions only, such as Viterbi decoders. However, the same techniques may be applied for decoders that use backward recursions—where backward recursion implies that data is processed in the reverse order from which it was received. An important application example is the Log-MAP (more formally known as log—'A Posteriori Probability') decoder, which utilizes both forward and backward recursions, and is found in turbo decoding applications. The reason that the same techniques apply is that the forward and backward recursions are each only trying to reproduce the encoding action, and they only differ in the direction in which data is processed. For that reason, for both forward and backward recursions, the state metrics or path metrics which are reset are the same, and the trellis sections at which the resets occur are the same.

The operation and methodology of path restriction and/or re-encoding MUXing is extendible, and may be used in various concatenated code applications, as the following descriptions and discussions demonstrate.

Figure 9:
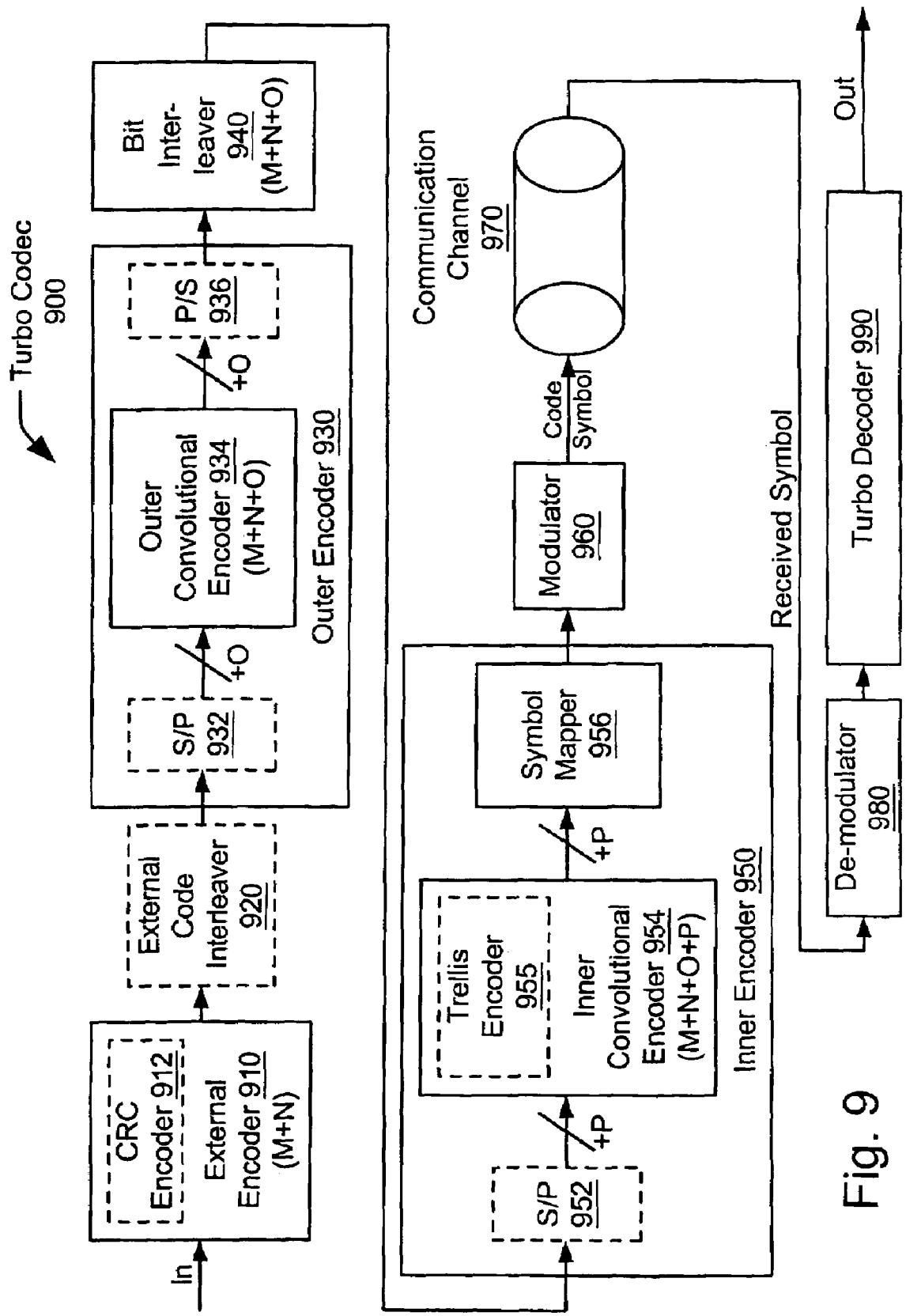
FIG. 9 is a system diagram illustrating an embodiment of a turbo codec built in accordance with the present invention.

FIG. 9 is a system diagram illustrating an embodiment of a turbo codec 900 built in accordance with the present invention. The turbo codec 900 receives an input signal that is fed to an external encoder 910. The external encoder 910 takes a number of sub-blocks of length S bits and adds redundancy to them to create sub-blocks of length S+R bits; collectively, these blocks form a block of length M+N bits. Inside of the external encoder 910, in certain embodiments of the invention, is a cyclic redundancy check (CRC) encoder 912. The output of the external encoder 910 is fed to an external code interleaver 920 that is used in certain embodiments of the invention. The external code interleaver 920 scrambles the order of the bits within the block that it processes. Note that, in general, the interleaver span is the length of the entire block, rather than a constituent sub-block.

Subsequently, the signal is passed to an outer encoder 930. Inside of the outer encoder 930 is an outer convolutional encoder 934 which would add redundancy to the data, transforming a block of input data of length M+N bits to a block of length M+N+O bits. Since the encoder, in general, would input and output multiple bits at a time (in parallel), a serial to parallel (S/P) converter 932 and a parallel to serial (P/S) converter 936 precede and follow the outer convolutional encoder 934, when it is necessary to perform the conversion to parallel encoded data to accommodate the outer convolutional encoder 934. When the bit stream being fed to the outer encoder 930 is already in parallel format, the converters 932 and 936 are not needed. However, they are shown to illustrate the adaptability of the present invention to accommodate a variety of data streams in various applications.

The signal emitted from the outer encoder 930 is passed to a bit interleaver 940. For a block of span N+M+O bits, it would have the same span. The signal is then passed to an inner encoder 950. The inner encoder 950 includes an inner convolutional encoder 954, that adds more redundancy to the input data, transforming a block of length M+N+O bits to one of length N+M+O+P bits. The inner encoder is followed by a symbol mapper 956, that maps a (multi-) bit description, say, of m bits, to one of $2^m$ constellation symbol possibilities. When needed, the inner convolutional encoder 954 is preceded by a S/P converter 952. The inner convolutional encoder 954 employs a trellis encoder 955 in certain embodiments of the invention. The trellis encoder 955 is any number of trellis encoders including those described above in various embodiments of the invention. The signal is then emitted from the inner encoder 950 and passed to a modulator 960 before a code symbol is transmitted over a communication channel 970. After transmission over the communication channel 970, the signal is first de-modulated using a de-modulator 980 and then passed to a turbo decoder 990 from which an output signal is emitted.

Figure 10A:
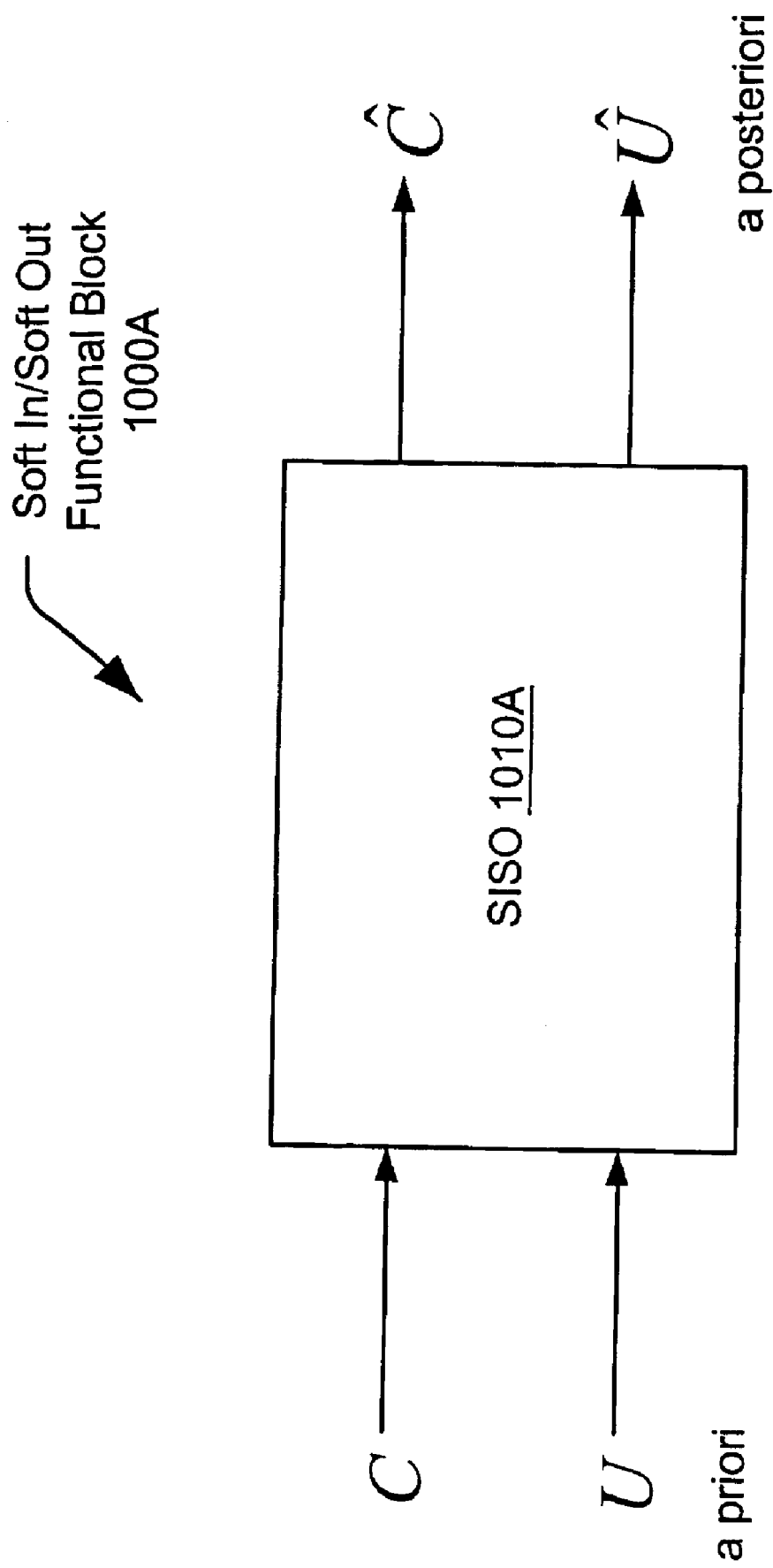
FIG. 10A is a system diagram illustrating an embodiment of a soft in/soft out functional block operating built in accordance with the present invention.

FIG. 10A is a system diagram illustrating an embodiment of a soft in/soft out (SISO) functional block 1000A operating built in accordance with the present invention. The SISO functional block 1000A employs a SISO block 1010A. Two signals C and U are provided as 'a priori' signals into the SISO block 1020A. After any operations within the SISO block 1010A, the two signals are provided as 'a posteriori' outputs (estimates with estimate reliabilities) $\hat{C}$ and $\hat{U}$. The SISO functional block 1010A is exemplary of a four port device, two inputs and two outputs, that is used in various embodiments of the invention.

From certain perspectives, the soft in/soft out (SISO) functional block 1000A is viewed as being a functional block that is operable to perform decoding of a coded data stream. For example, the two 'a priori' signals C and U are coded data streams, and the two 'a posteriori' signals $\hat{C}$ and $\hat{U}$ are decoded data streams. As will be seen in various embodiments of the invention, any number of soft in/soft out (SISO) functional blocks may be concatenated to perform inner and outer decoding of data streams.

Figure 10B:
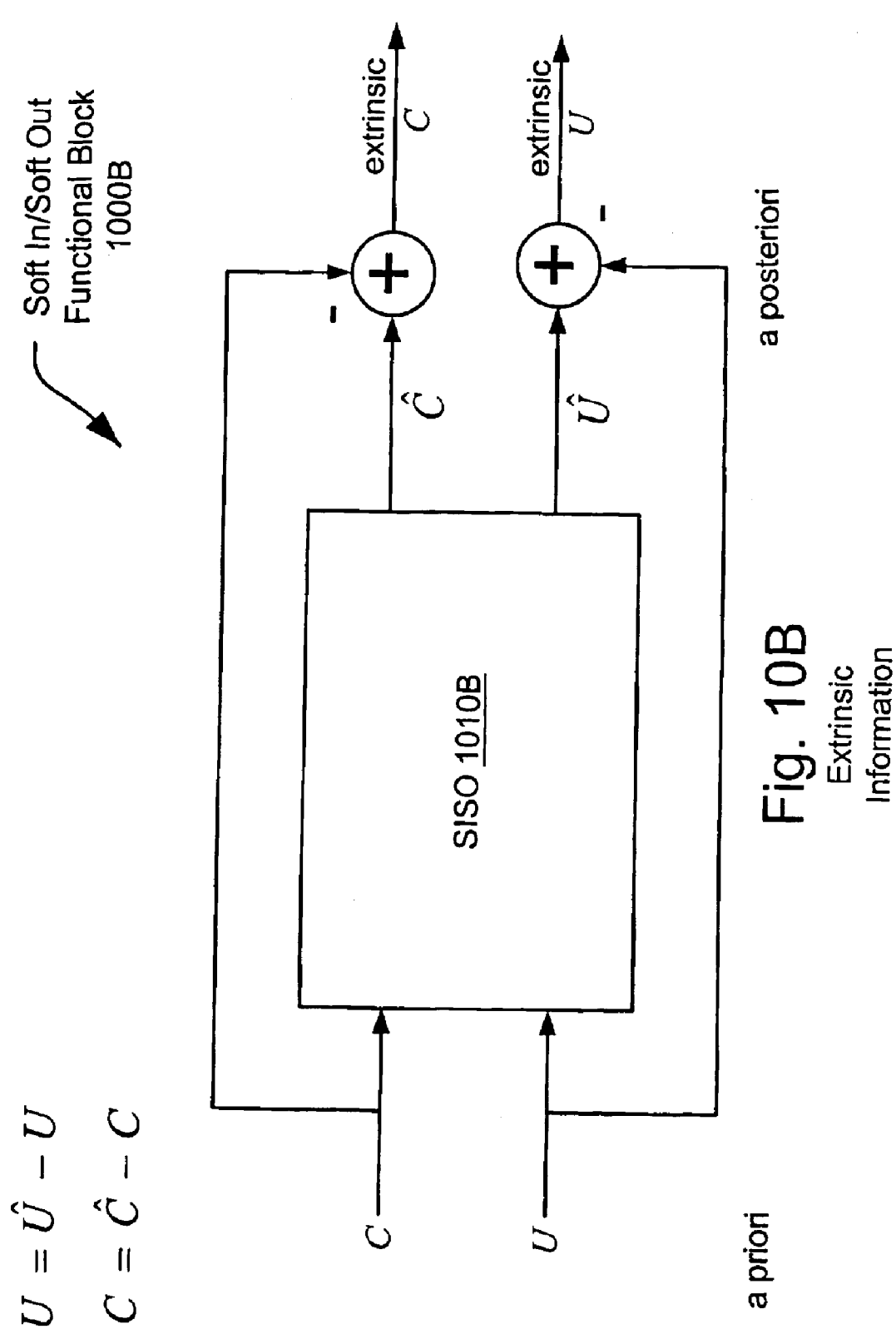
FIG. 10B is a system diagram illustrating an embodiment of a soft in/soft out functional block that generates extrinsic information in accordance with the present invention.

FIG. 10B is a system diagram illustrating an embodiment of a soft in/soft out (SISO) functional block 1000B that generates extrinsic information in accordance with the present invention. The SISO functional clock 1000B may be viewed as being a processor, from certain perspectives. The SISO functional block 1000B employs a SISO block 1010B. Two signals C and U are provided as 'a priori' signals into the SISO block 1010B. After any operations within the SISO block 1010A, the two signals are provided 'a posteriori' as outputs $\hat{C}$ and $\hat{U}$. Subsequent to being outputs as $\hat{C}$ and $\hat{U}$ from the SISO block 1020B, the original input signals may be subtracted from the outputs $\hat{C}$ and $\hat{U}$ to generate extrinsic information for C and/or U, respectively. The extrinsic C is viewed as being the resultant of the following equation: extrinsic U=$\hat{U}$-U. Similarly, the extrinsic C is viewed as being the resultant of the following equation: extrinsic C=$\hat{C}$-C. In some 4-port SISO blocks, only one or none of the outputs might be extrinsic outputs; the other could be an 'a posteriori' output.

The aforesaid SISO input and output signals contain reliability information, which in certain instances, contains more information than simply a logical '0' or '1' that represents a bit. Such information may tell how strongly the signal is actually estimated to be a '1' or '0.'

A number of soft in/soft out (SISO) functional blocks may be concatenated to perform decoding, e.g., inner and outer decoding, of data streams. When the SISO blocks are concatenated, and selected outputs are fed to another SISO decoder as an input, the relevant SISO output(s) must generate and employ extrinsic data stream(s).

Figure 11B:
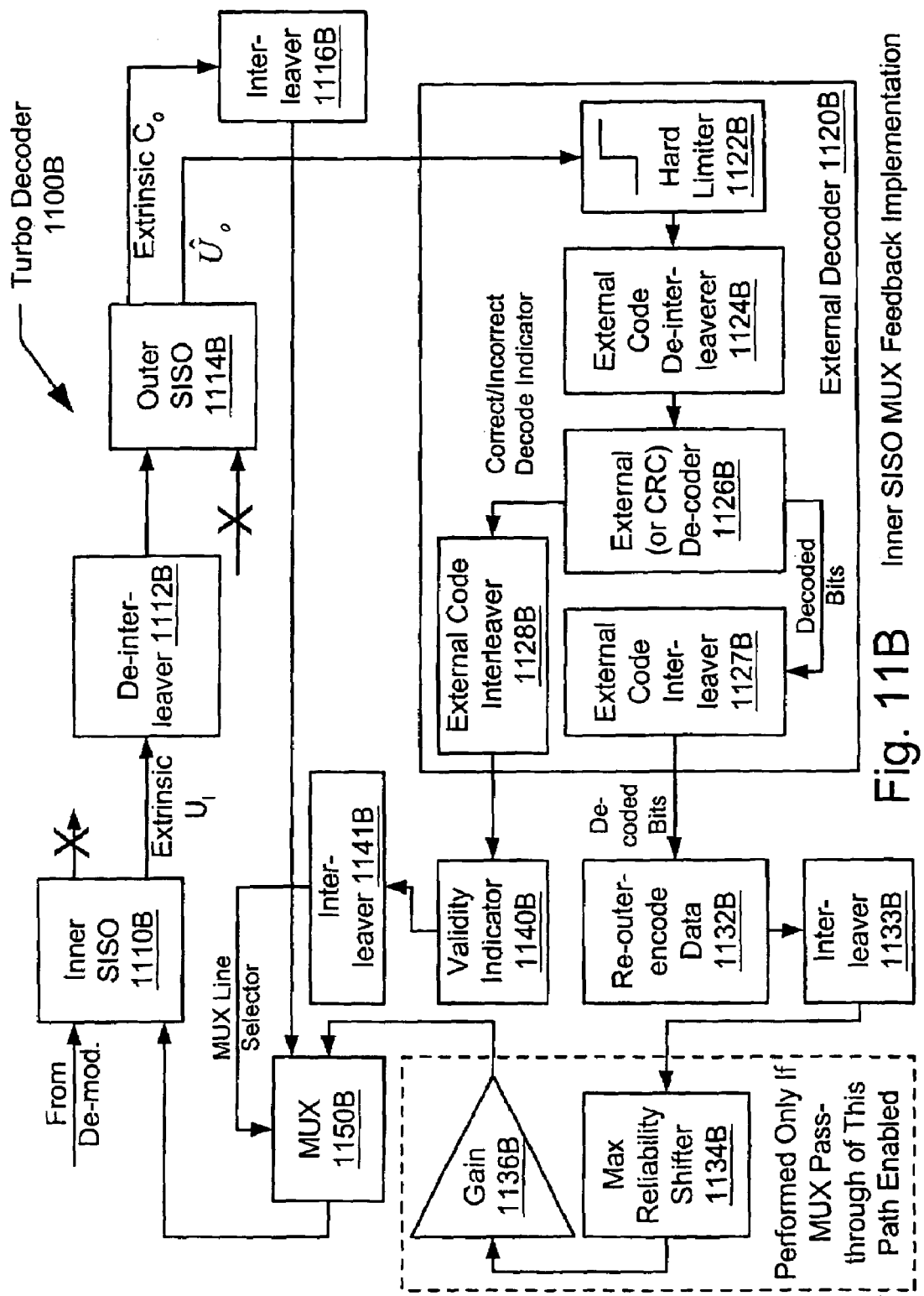
FIG. 11B is a system diagram illustrating an embodiment of a serial concatenated code turbo decoder that feeds back external decoding information to an inner SISO using a MUX method of decision forcing in accordance with the present invention.

The FIGS. 11A and 11B illustrate two different embodiments of serial concatenated code turbo decoders that may also be combined into a third embodiment. That is to say, the two turbo decoders 1100A and 1100B of the FIGS. 11A and 11B may be combined in a given embodiment, so that two sources of external decoder feedback are possible in a single embodiment.

FIG. 11A is a system diagram illustrating an embodiment of a serial concatenated code turbo decoder 1100A that feeds back external decoding information (from an external decoder 1 120A) to an outer SISO 1114A in accordance with the present invention. The turbo decoder 1100A is operable as the turbo decoder 990 of the FIG. 9, and it is also operable in other embodiments as well. The signal from a de-modulator is provided to an inner SISO block 1110A. An inner extrinsic $U_I$ signal is provided to a de-interleaver 1112A before being passed to the outer SISO block 1114A. An outer extrinsic $C_O$ signal is passed from the outer SISO 1114A to an interleaver 1116A before being passed as an 'a priori' input to the inner SISO 110A.

An outer $\hat{U}_o$ signal is passed from the outer SISO 1114 to the external decoder 1120A. The external decoder 1120A includes a hard limiter 1122A, an external code deinterleaver 1124A, an external (or CRC) decoder 1126A, an external code interleaver 1127A, and an external code interleaver 1128A. The outer $\hat{U}_o$ signal is fed to the hard limiter 1122A. The output from the hard limiter 1122A provides the input for the external (or CRC) decoder 1126A. The output from the external (or CRC) decoder 1126A provides the input for the external (or CRC) decoder 1126A. The external (or CRC) decoder 1126A provides decoded bits to the external interleaver code 1127A and a correct/incorrect decode indicator for use by the external code interleaver 1128A. The outputs from the external code interleaver 1127A and the external code interleaver 1128A cooperatively operate as the external coding feedback inputs to the outer SISO 1114A. They are shown operating cooperatively within the mutual circle to which they join.

The output signals (decoded bits, correct decoding indication) from the external decoder 1120 may be used in multiple ways. In one embodiment, a level-shifted version of the decoded bits may serve as an 'a priori' input for the outer SISO 1114A (when the external (or CRC) decoder 1126A decodes correctly; when it does not, an indeterminate 'a priori' indication would be sent to the outer SISO 1114A as 'a priori' input).

In another embodiment, correct decisions may be forced (via any of the previously described techniques for path restrictions) when the external (or CRC) decoder 1126A decodes correctly. Any of the explicitly disclosed methods of path restriction may be used, or extensions of path restriction as described within the various embodiments of the invention. This includes applying a path restriction technique to either the forward or backward recursions of the outer SISO 1114A, or applying a path restriction technique to both recursions.

FIG. 11B is a system diagram illustrating an embodiment of a serial concatenated code turbo decoder 1100B that feeds back external decoding information to an inner SISO 1110B using a MUX method of decision forcing in accordance with the present invention. The signal from a de-modulator is provided to an inner SISO block 1110B. An inner extrinsic $U_I$ signal is provided to a deinterleaver 1112B before being passed to an outer SISO block 1114B. An outer extrinsic $C_o$ signal is passed from the outer SISO 1114B to an interleaver 1116B before being passed as one of the inputs to a multiplexor (MUX) 1150B.

An outer $\hat{U}_o$ signal is passed from the outer SISO 1114B to an external decoder 1120B. The external decoder 1120B includes a hard limiter 1122B, an external code deinterleaver 1124B, an external (or CRC) decoder 1126B, an external code interleaver 1127B, and an external code interleaver 1128B. The outer $\hat{U}_o$ signal is fed to the hard limiter 1122B. The output from the hard limiter 1122B provides the input for the external (or CRC) decoder 1126B. The output from the external (or CRC) decoder 1126B provides the input for the external (or CRC) decoder 1126B. The external (or CRC) decoder 1126B provides decoded bits to the external code interleaver 1127B and a correct/incorrect decode indicator for use by the external code interleaver 1128B.

The external (or CRC) decoder 1126B provides a correct/incorrect decode indicator signal to an external code interleaver 1128B. The output from the external code interleaver 1128B is fed to a validity indicator block 1140B. The output from the validity indicator block 1140B is passed to an interleaver 1141B. The output of the interleaver 1141B serves as the input (MUX) line selector for the MUX 1150B.

The output from the re-outer-encode data block 1132B is passed to an interleaver 1133B. The output of the interleaver 1133B is passed to a block having operations that are performed only if the MUX pass-through of this particular path is enabled. These operations include a maximum reliability shifter 1134B and a gain 1136B. The output from the interleaver 1133B is fed to the maximum reliability shifter 1134B, whose output is then passed to the gain 1136B. The output from the gain 1136B is the other of the inputs provided to the MUX 1150B, the other being the output from the interleaver 1116B as described above. Again, it is the output of the interleaver 1141B that serves as the input (MUX) line selector for the MUX 1150B determining which of the two MUX inputs is to be selected.

The turbo decoders 1100A and 1100B of the FIGS. 11A and 11B demonstrate two embodiments of the present invention that may reduce BER floors in applications that benefit from a reduced BER noise floor. Note that an external code feedback technique like that used by the outer decoder of FIG. 11A may be combined with an external code feedback technique like that used by the inner decoder of the FIG. 11B, to cooperatively lower BER floors. There are also other methods in which the present invention is operable to achieve low BER floors using feedback from an external decoder.

Figure 12:
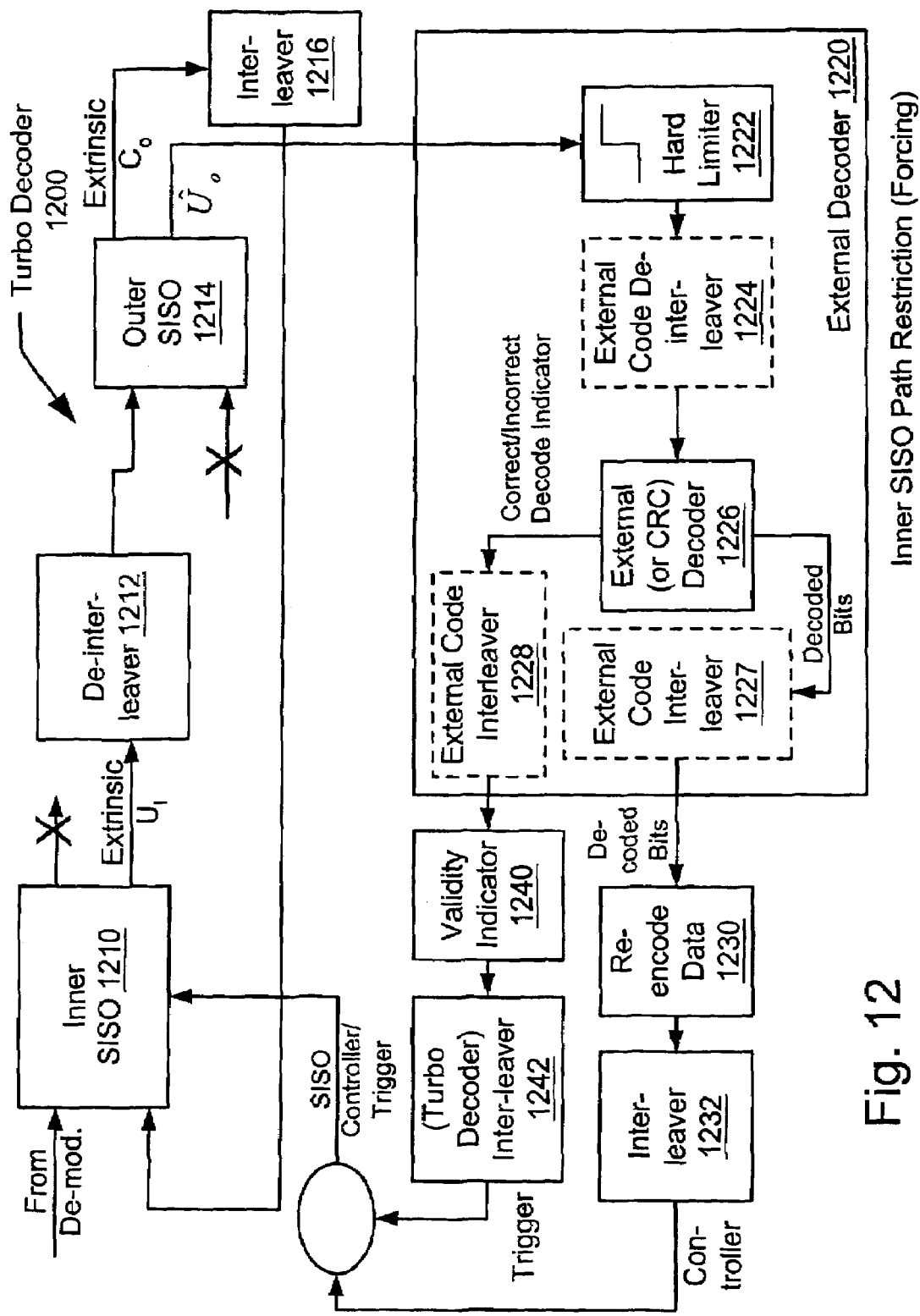
FIG. 12 is a system diagram illustrating an embodiment of a turbo decoder, having a path restriction (decision-forcing) implementation, that is built in accordance with the present invention.

FIG. 12 is a system diagram illustrating an embodiment of a turbo decoder 1200, having an inner SISO path restriction (forcing) implementation, that is built in accordance with the present invention. The turbo decoder 1200 is operable as the turbo decoder 990 of the FIG. 9, although it is also operable in other embodiments. The signal from a de-modulator is provided to an inner SISO block 1210. An inner extrinsic $U_I$ signal is provided to a de-interleaver 1212 before being passed to an outer SISO block 1214. An outer extrinsic $C_o$ signal is passed from the outer SISO 1214 to an interleaver 1216 before being passed back as an input to the inner SISO block 1210.

An outer $\hat{U}_o$ signal is passed from the outer SISO 1214 to an external decoder 1220. The external decoder 1220 includes a hard limiter 1222, an (optional) external code de-interleaver 1224, an external or CRC decoder 1226, and (optional) external code interleavers 1227 and 1228.

The outer $\hat{U}_o$ signal is fed to the hard limiter 1222. The output from the hard limiter 1222 provides the input for the (optional) external code de-interleaver 1224. The output from the (optional) external code de-interleaver 1224 is used as the input for the external (or CRC) decoder 1226. The external (or CRC) decoder 1226 provides decoded bits to the (optional) external code interleaver 1227 and a correct/incorrect decode indicator for use by the (optional) external code interleaver 1228.

The output signals (decoded bits, correct decoding indication) from the external (or CRC) decoder 1226 are provided to a validity indicator block 1240 and a re-encode data block 1230. The correct decoding indication from the external (or CRC) decoder 1226 may pass through the (optional) external code interleaver 1227 before getting to the re-encode data block 1230. The decoded bits from the external (or CRC) decoder 1226 may pass through the (optional) external code interleaver 1228 before getting to the validity indicator block 1240.

The output from the validity indicator block 1240 is passed to a (turbo decoder) interleaver 1242. The output from the re-outer-encode data block 1230 is passed to an interleaver 1232. The outputs of the interleaver 1232 and the (turbo decoder) interleaver 1242 are used as the controller and trigger of the inner SISO 1210, respectively, as they are shown operating cooperatively within the mutual circle to which they join. The turbo decoder 1200, having a path restriction (decision forcing) implementation, shows yet another embodiment of the present invention that is operable to achieve BER floors approaching those required for video applications and other applications that benefit from a greatly reduced BER noise floor. Again, as mentioned above, there are many different ways to perform path restriction, some of which have been explicitly described in the preceding text. Other extendible methods to perform path restriction are also included within the scope and spirit of the invention.

Note that a external code feedback technique like that used by the outer decoder of FIG. 11A may be combined with an external code feedback technique like that used by the inner decoder of 12, to cooperatively lower BER floors.

Figure 13:
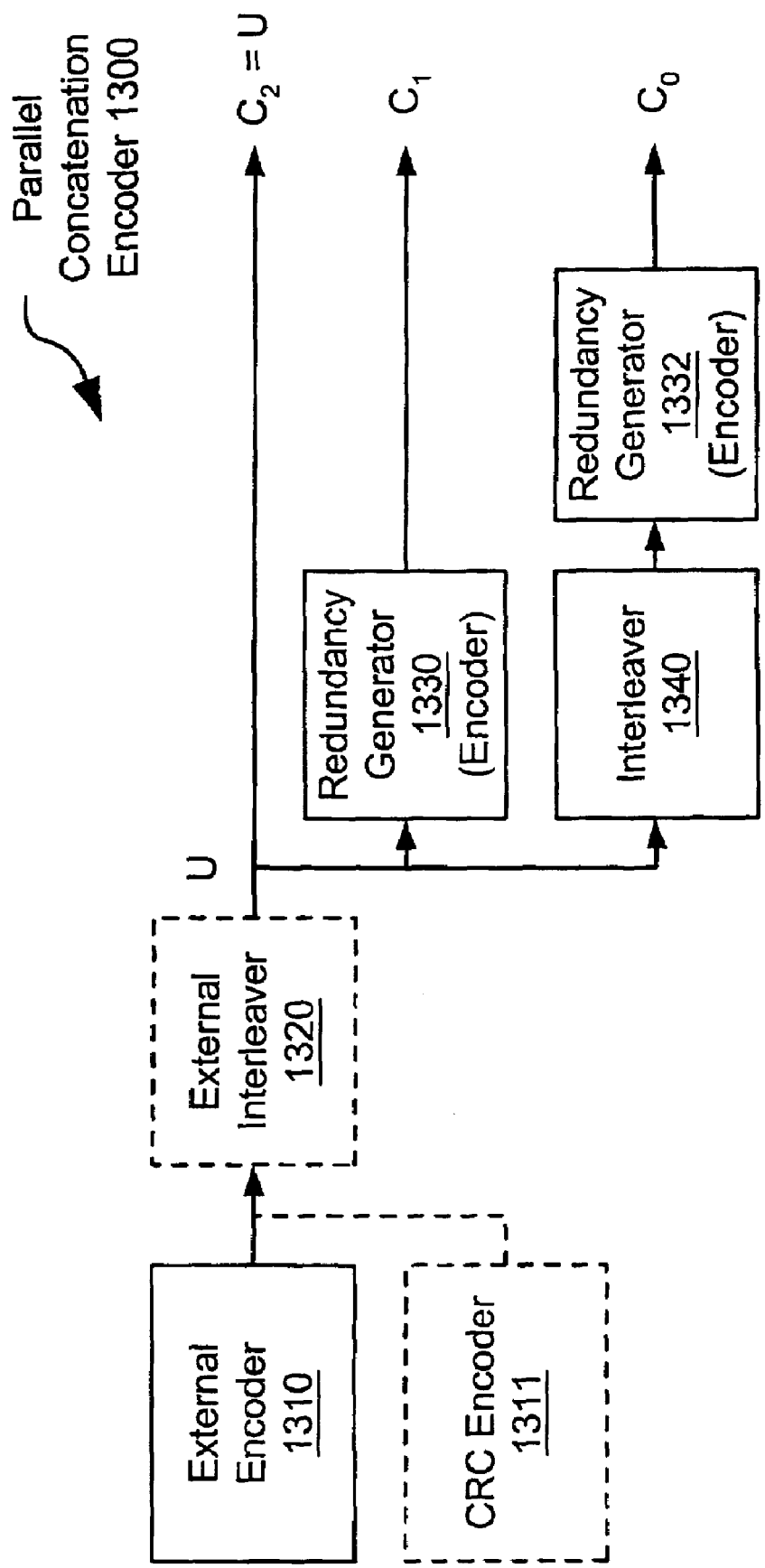
FIG. 13 is a system diagram illustrating an embodiment of a parallel concatenation encoder built in accordance with the present invention.

FIG. 13 is a system diagram illustrating an embodiment of a parallel concatenation encoder 1300 built in accordance with the present invention. An external encoder 1310, that may be a CRC encoder 1311 in certain embodiments of the invention, provides its output to an (optional) external interleaver 1320. The output of the (optional) external interleaver 1320, which is labeled as U, serves as one of the ultimate outputs of the parallel concatenation encoder 1300, namely, as $C_2$=U. The same output from the (optional) external interleaver 1320 is also provided to a redundancy generator block 1330 from which is output another of the ultimate outputs of the parallel concatenation encoder 1300, namely, as $C_1$. In addition, the same output from the (optional) external interleaver 1320 is also provided to an interleaver 1340 and subsequently to a redundancy generator block 1332 from which is output the last of the ultimate outputs of the parallel concatenation encoder 1300, namely, $C_0$. The parallel concatenation encoder 1300 shows one possible embodiment of a parallel concatenation encoder that operates in accordance with the present invention. Other embodiments of parallel concatenation encoders may also be constructed without departing from the scope and spirit of the invention.

Figure 14:
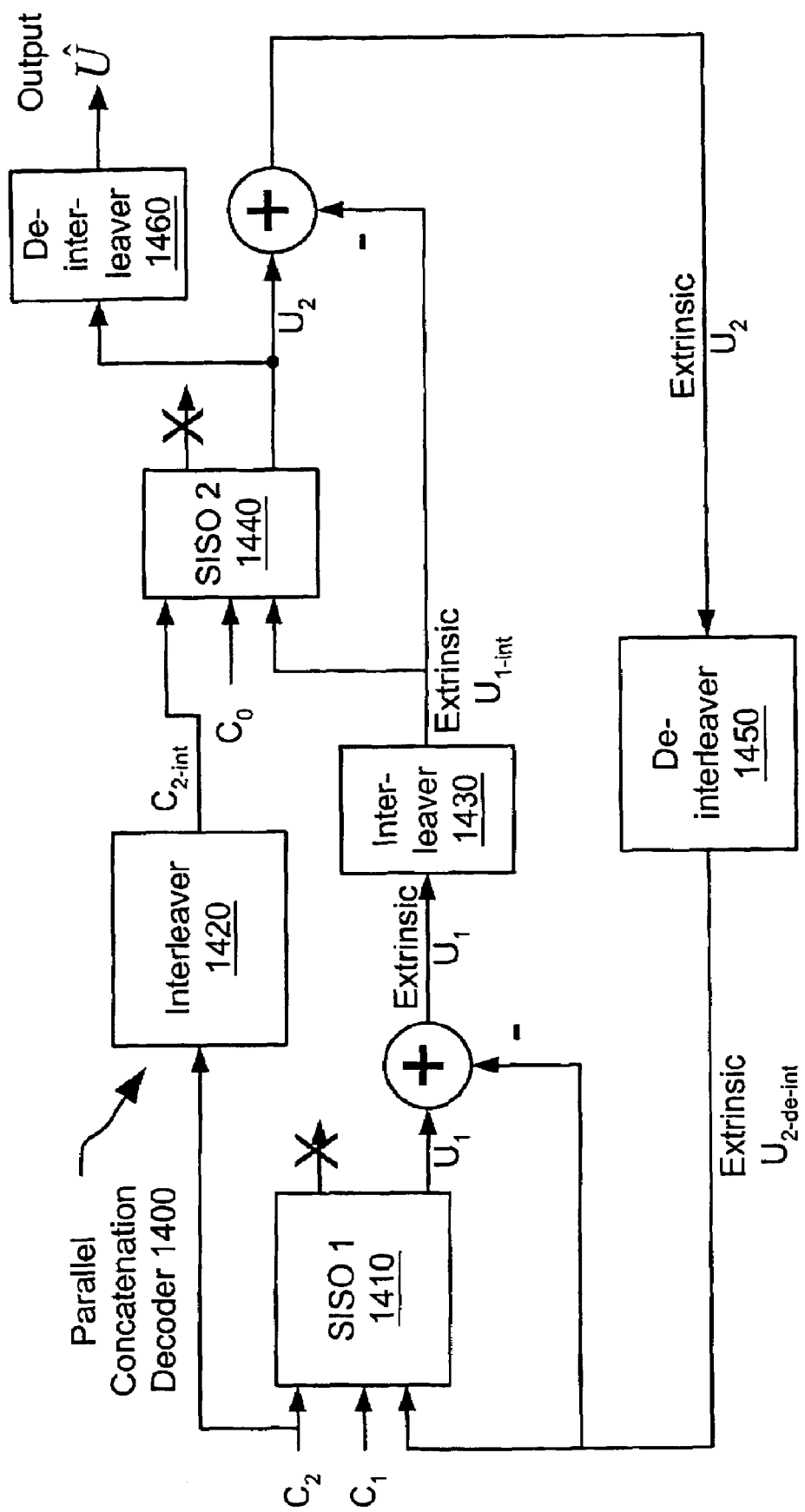
FIG. 14 is a system diagram illustrating an embodiment of a parallel concatenation decoder built in accordance with the present invention.

FIG. 14 is a system diagram illustrating an embodiment of a parallel concatenation decoder 1400 built in accordance with the present invention. In certain embodiments of the invention, the output signals $C_2$, $C_1$ and $C_0$ of the parallel concatenation encoder 1300 shown in FIG. 13 are the inputs to the parallel concatenation decoder 1400. The SISO blocks shown in the FIG. 14 may be viewed as five port devices, having three "C" inputs and two "U" inputs each.

Input signals $C_2$ and $C_1$ are provided to a SISO block 1 1410. The $C_2$ signal is also passed to an interleaver 1420. The output from the interleaver 1420, $C_{2\text{-}int}$, is passed as an input to a SISO block 2 1440. An input signal $C_0$ is also fed into the SISO block 2 1440.

The $U_1$ output from the SISO block 1 1410 is passed to a summing junction where the "a priori" $U_1$ input to the 8ISO block 1 1410 is subtracted from it to generate an extrinsic $U_1$ signal. The extrinsic $U_1$ signal is passed to interleaver 1430 whose output is then passed to both another summing junction and also as the 'a priori' input to SISO block 2 1440, shown as signal $U_{1\text{-}int}$. The "U" output of the SISO block 2 1440, shown as $U_2$, is summed with the negative of the output of the interleaver 1430, $U_{1\text{-}int}$, to generate an extrinsic $U_2$ signal. The extrinsic $U_2$ signal is passed to a de-interleaver 1450, and the output from the de-interleaver 1450 is passed back as the 'a priori' $U_1$ input to the SISO block 1 1410.

Before the output signal from the SISO block 2 1440, shown as $U_2$, is summed with the negative of the output of the interleaver 1430 to generate an extrinsic $U_2$ signal, a portion of this signal is fed to a deinterleaver 1460 to generate the decoder output signal $\hat{U}$.

Figure 15:
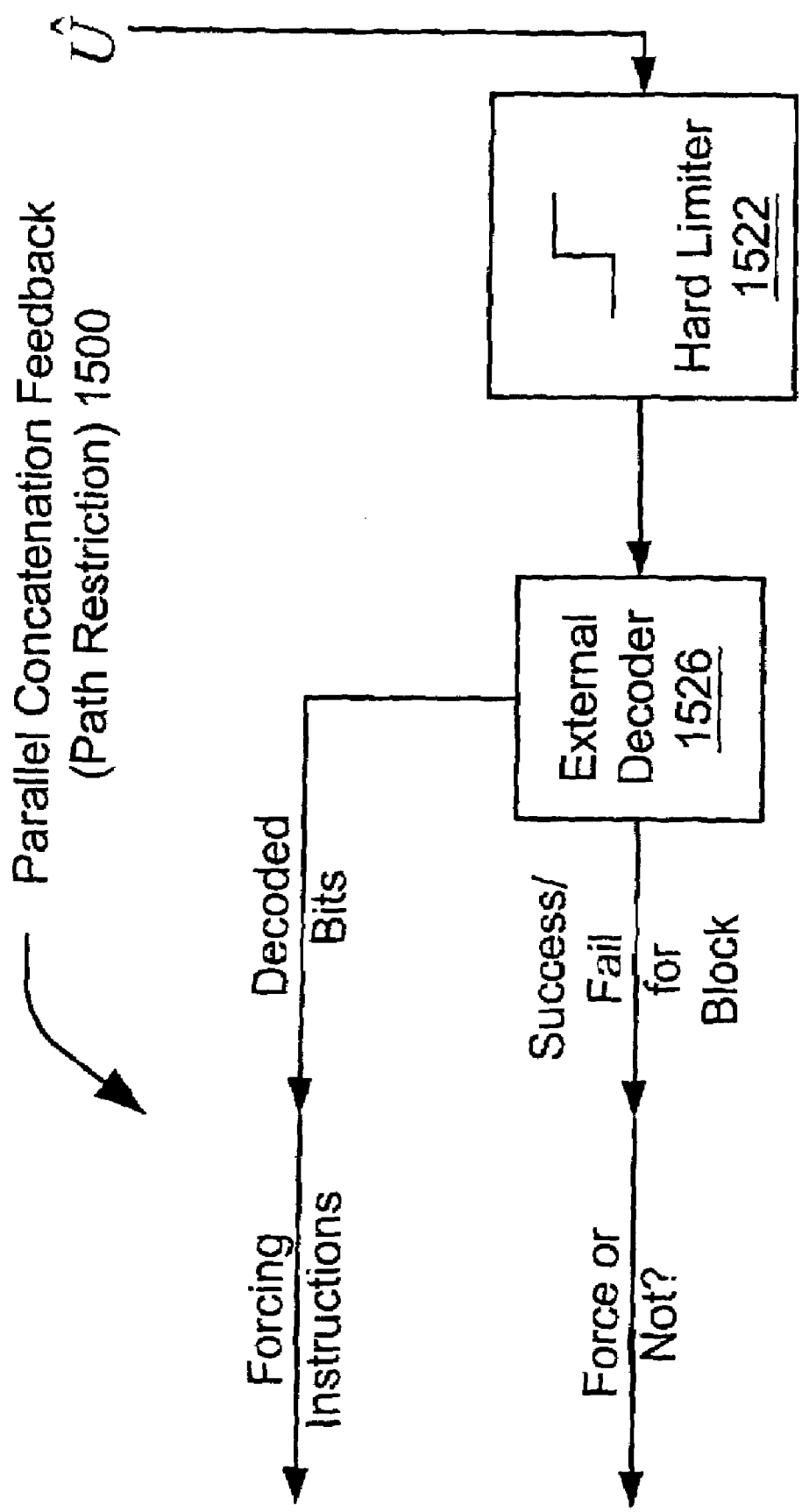
FIG. 15 is a functional diagram illustrating a parallel concatenation code application operating in a decision forcing, or path restriction, implementation in accordance with the present invention.

FIG. 15 is a functional diagram illustrating a parallel concatenation code application 1500 operating in a decision forcing, or path restriction, implementation in accordance with the present invention. The parallel concatenation feedback 1500 is operable with or without an external deinterleaver and interleaver blocks. Such blocks would be necessary if an external interleaver were used in the encoding processing. To simplify further discussion, we shall illustrate the case where external interleaving is not used in the encoding process. It is understood that the simpler case illustrated herein is exemplary, and that many other embodiments, including those employing external deinterleaving, may be achieved without departing from the scope and spirit of the invention.

An input signal shown as $\hat{U}$ is fed into hard limiter 1522. The output from the hard limiter 1522 is fed external decoder 1526. In this embodiment, it is noted that a external code could represent many different types of block-based codes, including a CRC code, Reed Solomon or BCH block code, a Hamming code, or a Parity Check Code, among others. Moreover, this external code may be primarily intended and used for error detection and/or error correction code. The identifying feature of this external code is that it is a block code, and as such, its data span is confined to a block length, and also that the decoder should be able to indicate whether the block that has been decoded has actually been correctly decoded—with a high degree of reliability.

The external decoder 1526 has two outputs. These outputs are both its decoded bits and information indicating whether the external code block was successfully decoded—i.e., decoded with no errors. This information is shown as the success/fail for block output signal emitting from the external decoder 1526. It is also noted that, in the application described herein, the size of an external block is generally shorter than the size of a turbo decoder block (whose span is defined by the length of the turbo encoder's interleaver). Therefore, external code error detection functions are typically repeated on several blocks to cover all of the bits in a longer, turbo code block.

The 'successful decoding' output of external decoder 1526 may be interpreted as 'forcing information,' regarding whether or not to force particular bit decisions (within the turbo decoder). The other, 'bit decisions' output of external decoder 1526 contains 'instructions,' in other words, the actual values that may that may (or may not) be forced within the turbo decoder.

As an example, when the parallel concatenation code application 1500 of the FIG. 15 is applied to embodiments of the invention operable as shown in the FIG. 14, the instructions and forcing information are then fed to the SISO 1 block 1410, where the path forcing restrictions would be imposed. Alternatively, (but usually, with less BER floor lowering effect) the instructions and forcing information may be passed through interleaving blocks (to reassemble them in the proper order) and then be fed to the SISO block 2 1440 to implement instantiated decision forcing via path restriction.

Figure 16:
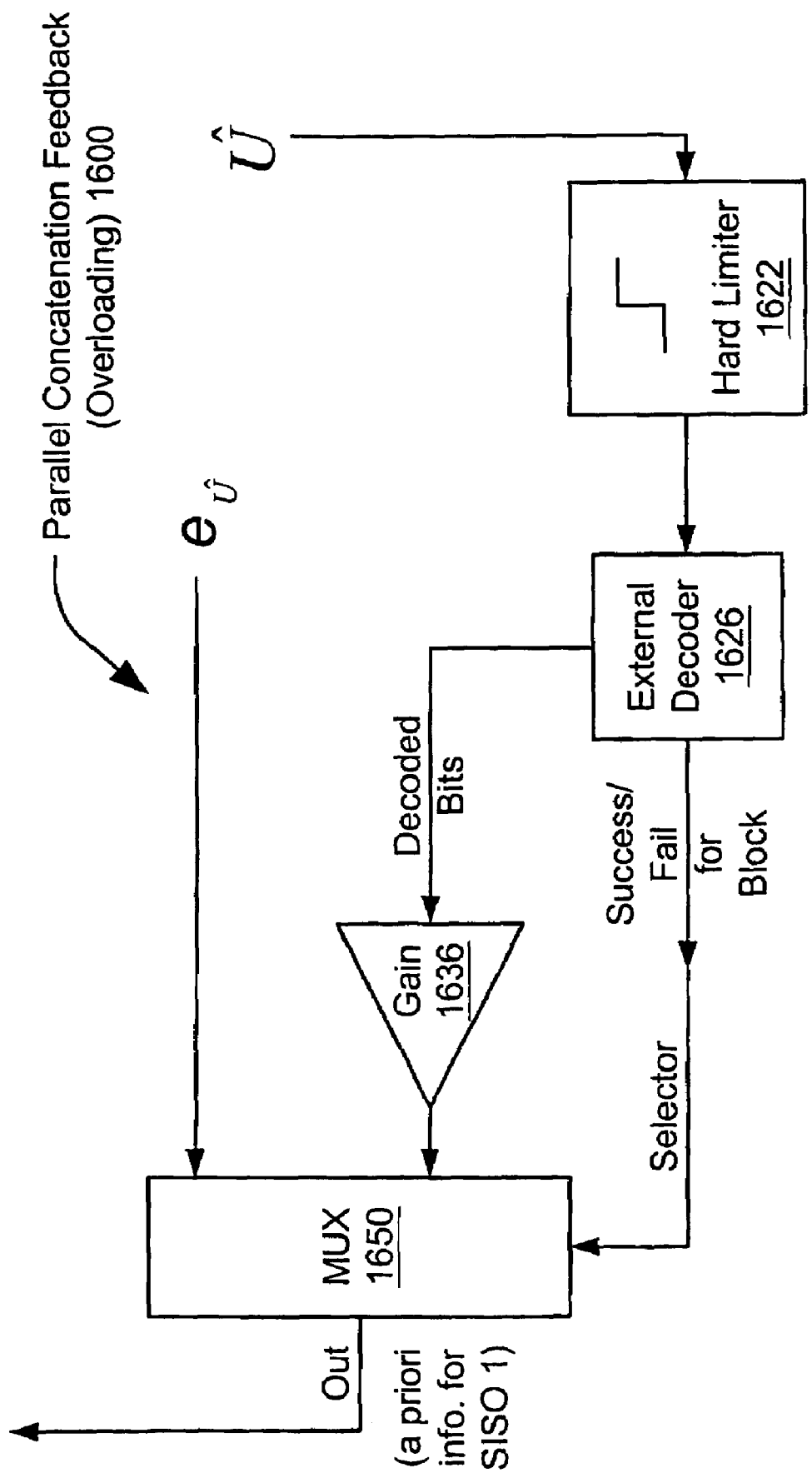
FIG. 16 is a functional diagram illustrating a parallel concatenation code application with feedback operating in an overloading implementation in accordance with the present invention.

FIG. 16 is a functional diagram illustrating a parallel concatenation code application 1600 with feedback operating in an overloading implementation in accordance with the present invention. This particular embodiment is based on the assumption that an external interleaver was not used in the encoding process. However, it is clear that the invention is operable within situations where one may be used as well. Again, it is understood that the simpler case illustrated herein is exemplary, and that many other embodiments, including those employing external interleaving, may be achieved without departing from the scope and spirit of the invention.

An input signal shown as $e_{\hat{U}}$ is fed as one of the inputs to a multiplexor (MUX) 1650. An input signal shown as is fed into a hard limiter 1622. The output from the hard limiter 1622 is fed into an external decoder 1626. The external decoder 1626 may be a CRC decoder in certain embodiments of the invention. Decoded bits, provided by the external decoder 1626, are passed through a gain 1636 whose output is provided as the other of the inputs of the MUX 1650.

One output of external decoder 1626 includes information of a decision of success or fail for a block on which the parallel concatenation feedback 1600 operates. This output from external decoder 1626 serves as the selector of MUX 1650 to determine which of the output from gain 1636 or the input signal shown as $\hat{U}$ is to be used as an output that is fed back to the inner SISO within the parallel concatenation feedback 1600.

Figure 17:
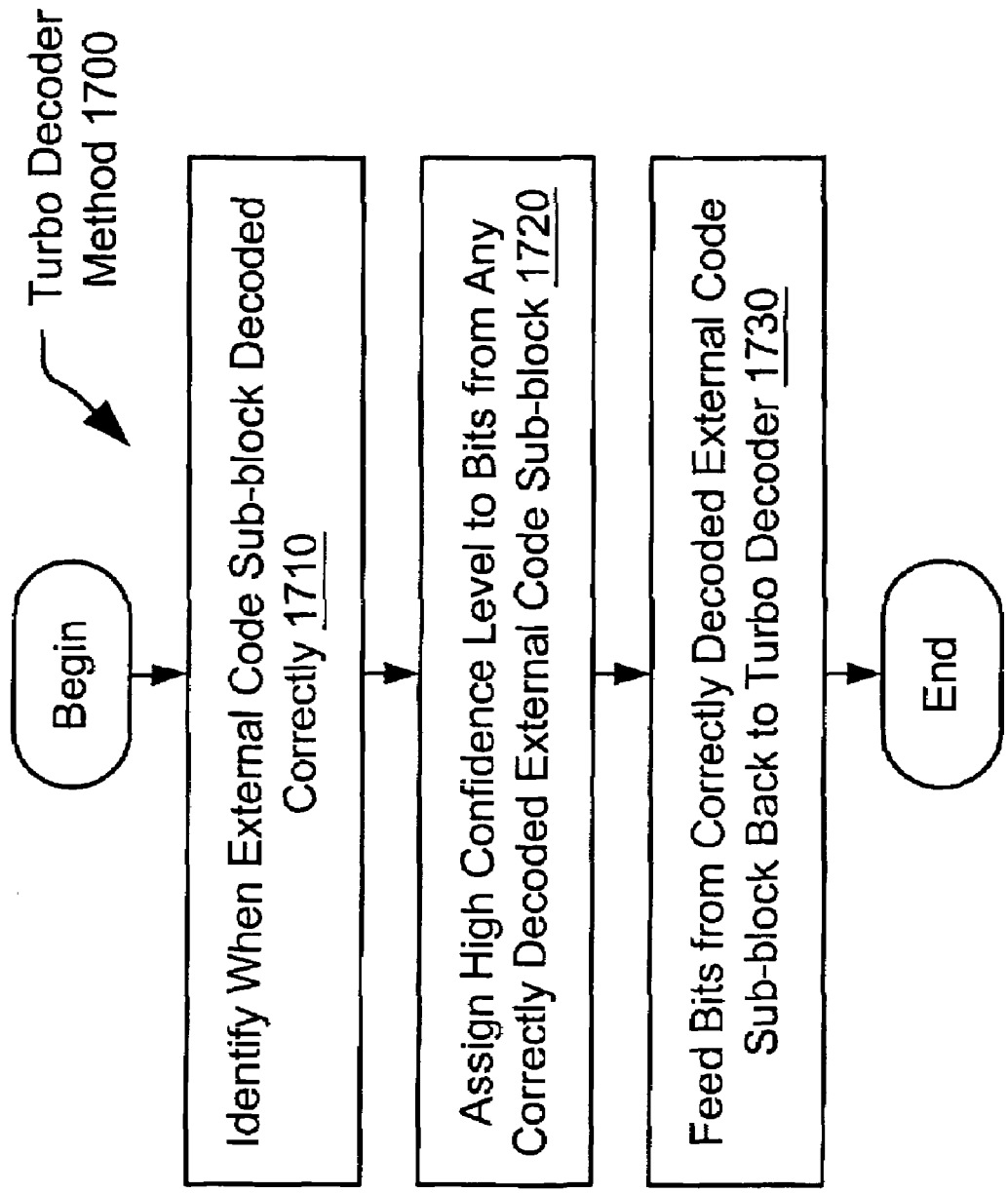
FIG. 17 is a functional flow chart illustrating an embodiment of a turbo decoder method performed in accordance with the present invention.

FIG. 17 is a functional flow chart illustrating an embodiment of a turbo decoder method 1700 performed in accordance with the present invention. In a chart item 1710, an identification is made when an external code sub-block has been decoded correctly. The external code sub-block is a cyclic redundancy check (CRC) block in certain embodiments of the invention. Then, in a chart item 1720, a high confidence level is assigned to bits from any correctly decoded external code sub-block. In chart item 1730, the bits from a correctly decoded external code sub-block are fed back to the turbo decoder as inputs with decision emphasis. The emphasized decisions of bits from the correctly decoded external code sub-block will tend to influence many other bit decisions in subsequent decoding iterations.

The turbo decoder method 1700 is operable when the external decoder's correct decisions are fed back to an outer SISO in a serially concatenated code application, or the 'second' SISO (that operates on source bit interleaved data) in a parallel concatenated code application. The technique may also involve external deinterleaving and external interleaving between sub-blocks of the external code bits in other embodiments as well.

Figure 18:
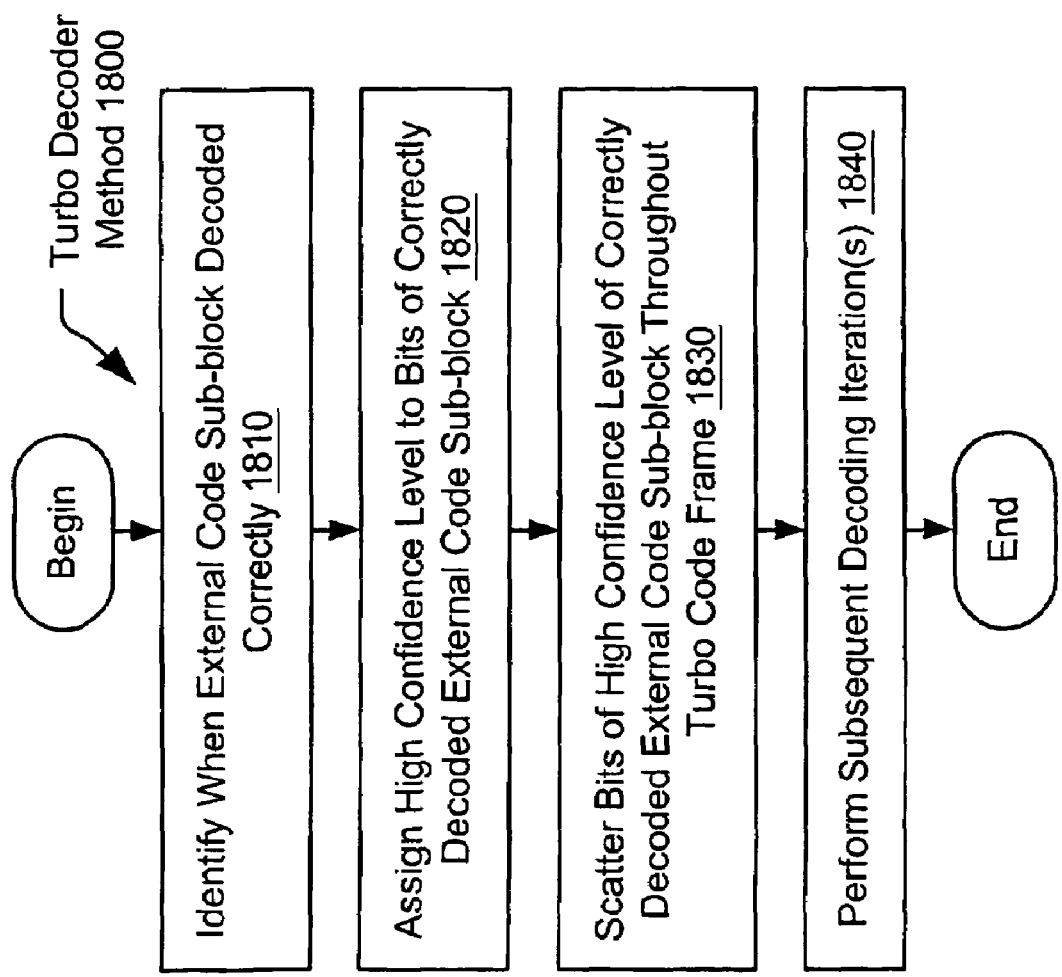
FIG. 18 is a functional flow chart illustrating another embodiment of a turbo decoder method performed in accordance with the present invention.

FIG. 18 is a functional flow chart illustrating another embodiment of a turbo decoder method 1800 performed in accordance with the present invention. In a chart item 1810, an identification is made when a external code sub-block has been decoded correctly. Again, the external code sub-block is a cyclic redundancy check (CRC) block in certain embodiments of the invention. In a chart item 1820, a high confidence level is assigned to the bits derived from any correctly decoded external code sub-block. In chart item 1830, bits of high confidence derived from one or more correctly decoded external code sub-blocks is scattered (via interleaving) throughout a turbo code frame, that is typically larger-than a sub-block. Then, in a chart item 1840, one or more subsequent decoding iterations(s) are performed, with decision emphasis applied to the high confidence bits derived from correctly decoded external code sub-blocks.

The fact that the high confidence bits from a correctly decoded external code sub-block are scattered throughout the turbo decoded frame can improve decoder BER performance in subsequent iterative passes in the decoding process. The turbo decoder method 1800 is operable when the external decoder's correct decisions are fed back to an inner SISO in a serial concatenated turbo code application, or to the first decoder (which does not have source bit interleaving) in a parallel concatenated code application. The technique may also involve external deinterleaving and external interleaving in certain embodiments as well.

It is also noted that, in general, external decoding and external decoding feedback as previously described may be performed at any (or all) iteration stages within the turbo decoding process.

While various embodiments of the invention have been described, it will be apparent to those of ordinary skill in the art that many more embodiments and implementations are possible that are within the scope of this invention.

What is claimed is:

1. An iterative decoder, comprising:
   an internal code decoder operable to perform iterative decoding of a data block; and
   an external code decoder capable of supplying a feedback signal to the internal decoder wherein the feedback signal is used to influence selective decisions during subsequent decoding iterations of the data block, wherein the data block comprises a turbo code data block comprising a plurality of sub-blocks; and the external code decoder performs decoding on a sub-block basis.

2. The iterative decoder of claim 1, wherein the external code decoder performs error detection processing on one of the sub-blocks within the plurality of sub-blocks.

3. The iterative decoder of claim 2, wherein the external code decoder performs error correction processing on the one of the sub-blocks within the plurality of sub-blocks.

4. An iterative decoder, comprising:
   an internal code decoder operable to perform iterative decoding of a data block; and
   an external code decoder capable of supplying a feedback signal to the internal decoder wherein the feedback signal is used to influence selective decisions during subsequent decoding iterations of the data block, wherein the data block comprises a turbo code data block;
   the external code decoder further comprises an external code interleaver and an external code deinterleaver; and
   each of the external code interleaver and the external code deinterleaver is operable to process a plurality of data having a span that is as long as a span of the turbo code data block.

5. An iterative decoder method, comprising:
   performing iterative internal decoding of a data block; and
   feeding back external decoding information to influence selective decisions during subsequent internal decoding iterations of the data block;
   wherein the data block comprises a turbo code data block comprising a plurality of sub-blocks; and further comprising performing decoding on a sub-block basis; and performing error detection processing on one of the sub-blocks within the plurality of sub-blocks.

6. An iterative decoder method, comprising:
   performing iterative internal decoding of a data block; and
   feeding back external decoding information to influence selective decisions during subsequent internal decoding iterations of the data block, wherein the data block comprises a turbo code data block comprising a plurality of sub-blocks; and further comprising performing decoding on a sub-block basis; and performing error detection processing on one of the sub-blocks within the plurality of sub-blocks.

7. An iterative decoder, comprising:
   means for performing iterative decoding of a data block; and
   means for supplying a feedback signal to the internal decoder wherein the feedback signal is used to influence selective decisions during subsequent decoding iterations of the data block, wherein the data block comprises a turbo code data block comprising a plurality of sub-blocks; and the means for performing external code decoding performs decoding on a sub-block basis.

8. The iterative decoder of claim 7, wherein the means for performing external code decoding performs error detection processing on one of the sub-blocks within the plurality of sub-blocks.

9. The iterative decoder of claim 8, wherein the means for performing external code decoding performs error correction processing on the one of the sub-blocks within the plurality of sub-blocks.

10. An iterative decoder, comprising:
    means for performing iterative decoding of a data block; and
    means for supplying a feedback signal to the internal decoder wherein the feedback signal is used to influence selective decisions during subsequent decoding iterations of the data block, wherein
    the data block comprises a turbo code data block;
    the means for performing external code decoding further comprises means for performing external code interleaving and means for performing external code deinterleaving; and
    each of the means for performing external code interleaving and the means for performing external code deinterleaving is operable to process a plurality of data having a span that is as long as a span of the turbo code data block.

11. An iterative decoder, comprising:
    an internal code decoder operable to perform iterative decoding of a data block; and
    an external code decoder capable of supplying a feedback signal to the internal decoder wherein the feedback signal is used to influence selective decisions during subsequent decoding iterations of the data block;
    wherein the data block comprises a turbo code data block comprising a plurality of sub-blocks;
    the external code decoder performs decoding on a sub-block basis;
    the external code decoder performs error detection processing on one of the sub-blocks within the plurality of sub-blocks; and
    the external code decoder performs error correction processing on the one of the sub-blocks within the plurality of sub-blocks.

12. An iterative decoder, comprising:
    an internal code decoder operable to perform iterative decoding of a data block; and
    an external code decoder capable of supplying a feedback signal to the internal decoder wherein the feedback signal is used to influence selective decisions during subsequent decoding iterations of the data block;
    wherein the data block comprises a turbo code data block;
    the external code decoder further comprises an external code interleaver and an external code deinterleaver; and
    each of the external code interleaver and the external code deinterleaver is operable to process a plurality of data having a span that is as long as a span of the turbo code data block.

* * * * *